(12) United States Patent
Suzuki et al.

(10) Patent No.: US 9,831,062 B2
(45) Date of Patent: Nov. 28, 2017

(54) METHOD FOR PATTERN MEASUREMENT, METHOD FOR SETTING DEVICE PARAMETERS OF CHARGED PARTICLE RADIATION DEVICE, AND CHARGED PARTICLE RADIATION DEVICE

(71) Applicant: Hitachi High-Technologies Corporation, Minato-ku, Tokyo (JP)

(72) Inventors: Makoto Suzuki, Tokyo (JP); Satoru Yamaguchi, Tokyo (JP); Kei Sakai, Tokyo (JP); Miki Isawa, Tokyo (JP); Satoshi Takada, Tokyo (JP); Kazuhisa Hasumi, Tokyo (JP); Masami Ikota, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/760,322

(22) PCT Filed: Jan. 22, 2014

(86) PCT No.: PCT/JP2014/051170
§ 371 (c)(1),
(2) Date: Jul. 10, 2015

(87) PCT Pub. No.: WO2014/115740
PCT Pub. Date: Jul. 31, 2014

(65) Prior Publication Data
US 2015/0357158 A1 Dec. 10, 2015

(30) Foreign Application Priority Data

Jan. 23, 2013 (JP) .................................. 2013-009731
Jan. 23, 2013 (JP) .................................. 2013-009735

(51) Int. Cl.
*H01J 37/30* (2006.01)
*H01J 37/28* (2006.01)

(52) U.S. Cl.
CPC .............. *H01J 37/30* (2013.01); *H01J 37/28* (2013.01); *H01J 2237/2814* (2013.01); *H01J 2237/2817* (2013.01); *H01J 2237/3175* (2013.01)

(58) Field of Classification Search
USPC ........................................................ 250/306
See application file for complete search history.

(56) References Cited

U.S. PATENT DOCUMENTS 6,091,249 A 7/2000 Talbot et al.
6,566,655 B1 * 5/2003 Choo ................. G01N 23/2251
250/306

(Continued)

FOREIGN PATENT DOCUMENTS

JP 10-313027 A 11/1998
JP 2006-234789 A 9/2006

(Continued)

OTHER PUBLICATIONS

International Search Report (PCT/ISA/210) dated Mar. 18, 2014 with English-language translation (four (4) pages).

*Primary Examiner* — Phillip A Johnston
(74) *Attorney, Agent, or Firm* — Crowell & Moring LLP

(57) ABSTRACT

An object of the present invention is to provide a method for pattern measurement and a charged particle radiation device in which a pattern formed by using a DSA technique can be very precisely measured and inspected. According to an aspect for achieving the object, a method for pattern measurement or a charged particle radiation device for realizing the measurement is proposed as follows. A charged particle is radiated to a polymer compound used for a self-organization lithography technique, and a specific polymer is (Continued)

considerably contracted as compared to the other polymer among multiple polymers forming the polymer compound. Thereafter, dimensions between multiple edges of the other polymer are measured, based on a signal obtained by scanning a region including the other polymer with the charged particle beam.

10 Claims, 22 Drawing Sheets

(56) References Cited

U.S. PATENT DOCUMENTS

| | | |
|---|---|---|
| 7,683,319 B2 | 3/2010 | Makino et al. |
| 8,114,306 B2 | 2/2012 | Cheng et al. |
| 8,636,914 B2 * | 1/2014 | Nakamura ............ G03F 7/0002 216/41 |
| 2010/0295183 A1 | 11/2010 | Sandhu et al. |
| 2011/0194778 A1 | 8/2011 | Sakai et al. |
| 2012/0292502 A1 | 11/2012 | Langer et al. |

FOREIGN PATENT DOCUMENTS

| | | |
|---|---|---|
| JP | 2009-81369 A | 4/2009 |
| JP | 2009-236606 A | 10/2009 |
| JP | 2010-92949 A | 4/2010 |
| JP | 2010-269304 A | 12/2010 |
| JP | 2012-527773 A | 11/2012 |
| JP | 2012-244142 A | 12/2012 |

* cited by examiner

[Fig. 1A]
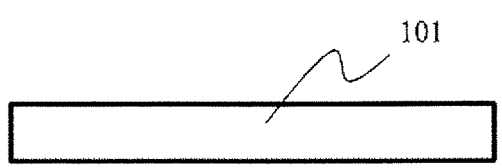
[Fig. 1B]
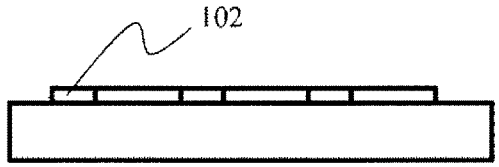
[Fig. 1C]
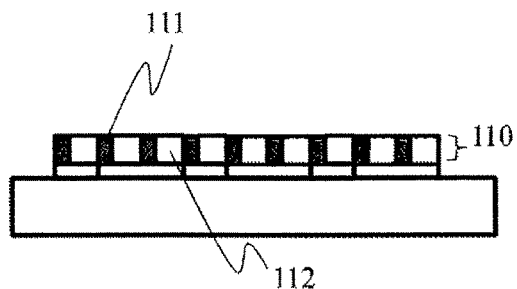
[Fig. 1D]
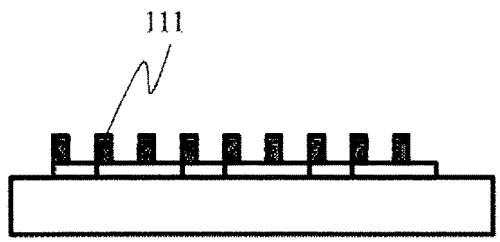

[Fig. 2]
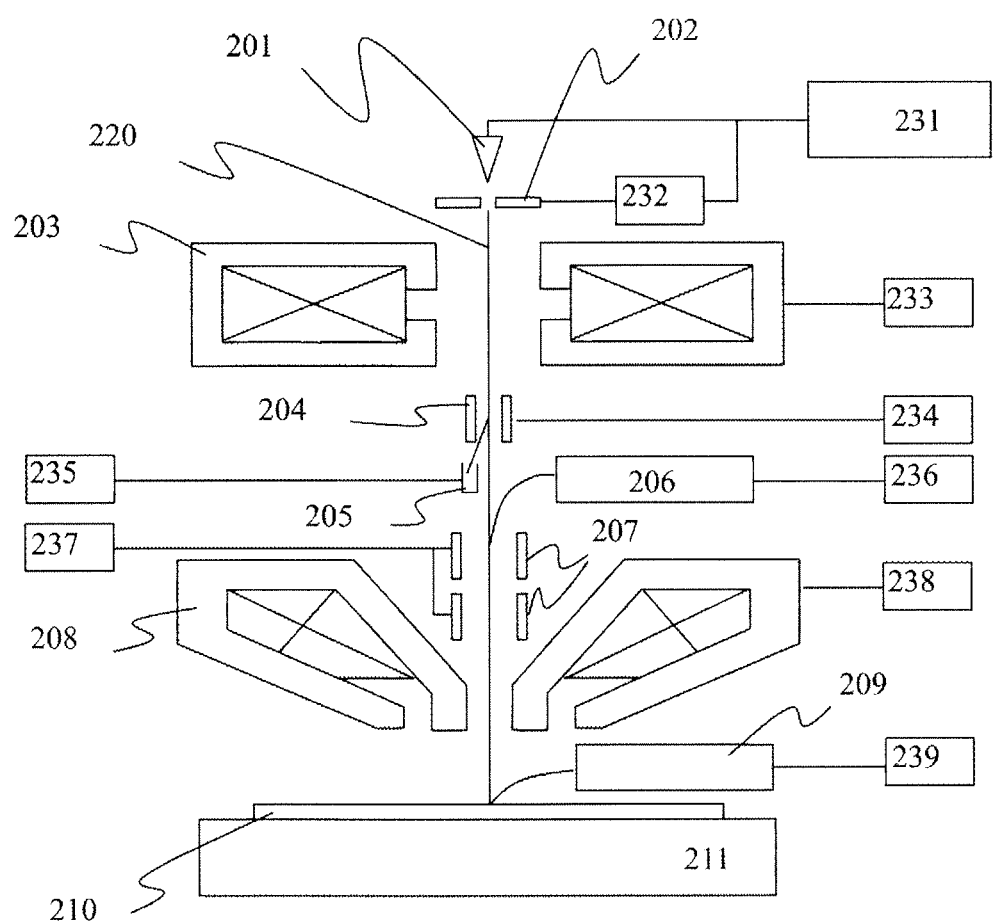

[Fig. 3A]      [Fig. 3B]      [Fig. 3C]
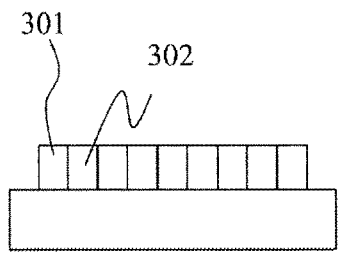
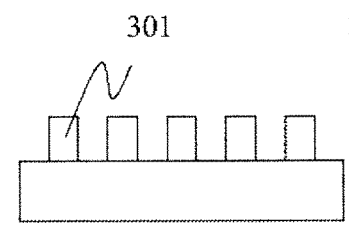
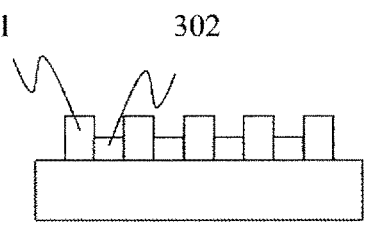
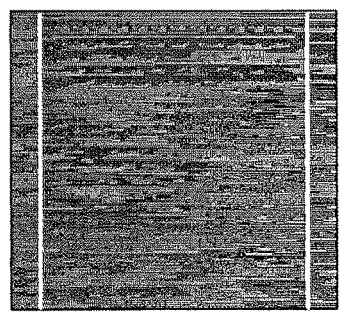
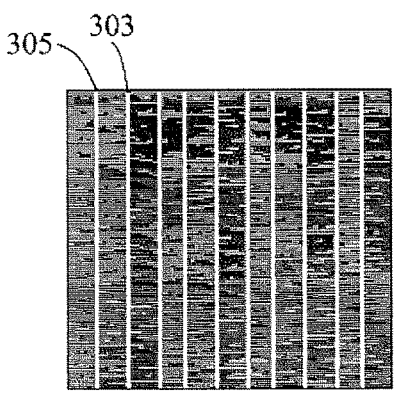
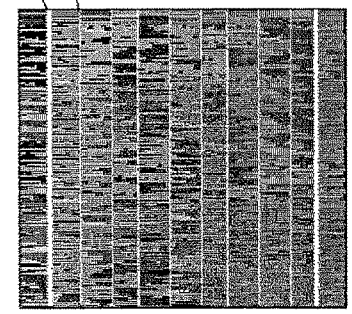
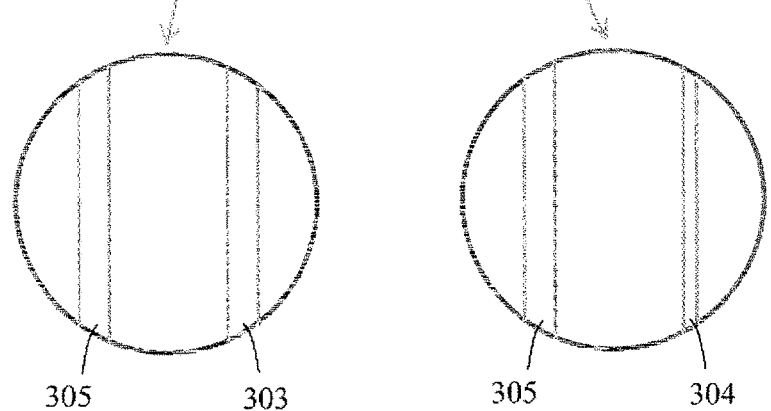

[Fig. 4A] 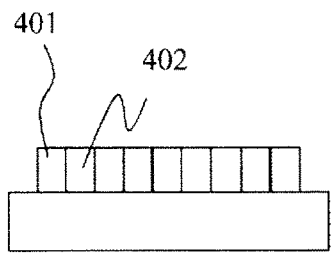
[Fig. 4B] 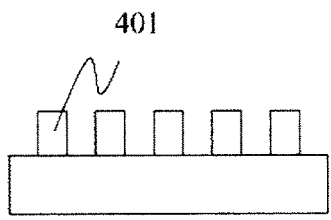
[Fig. 4C] 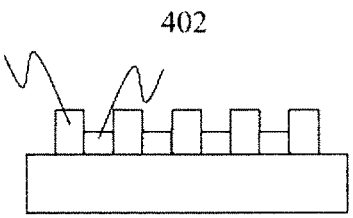
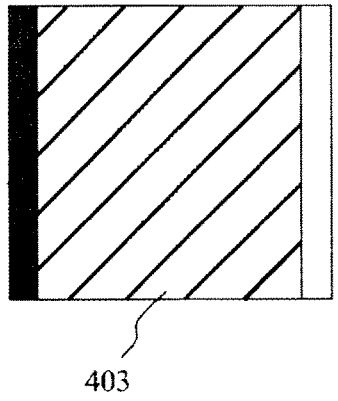
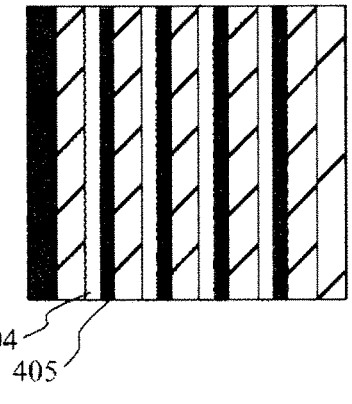
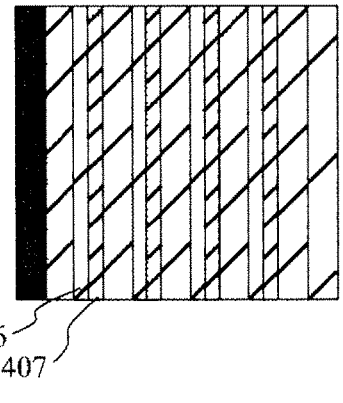
DETECTOR DIRECTION →     DETECTOR DIRECTION →     DETECTOR DIRECTION →

[Fig. 5]
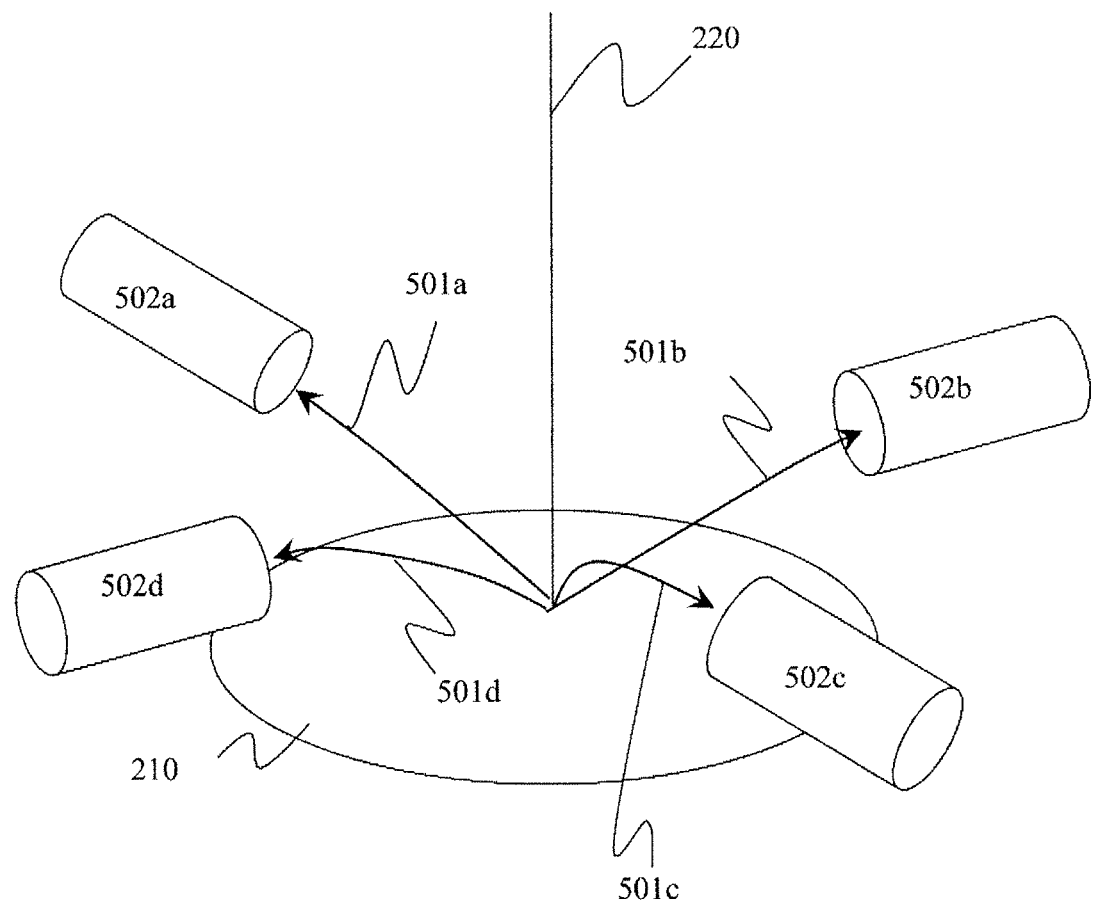

[Fig. 6]
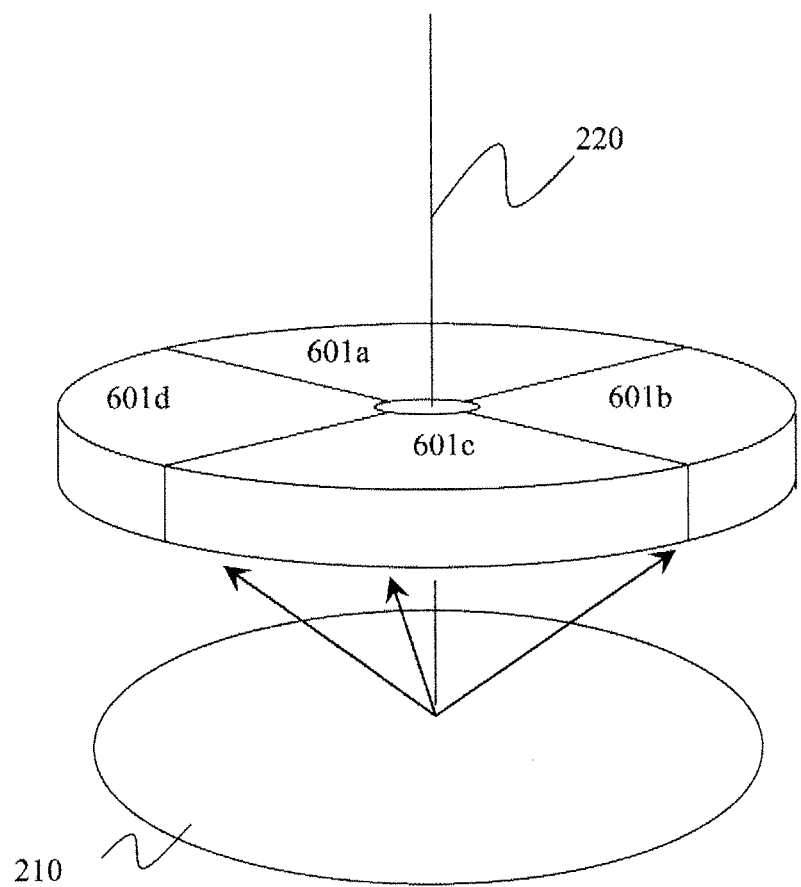

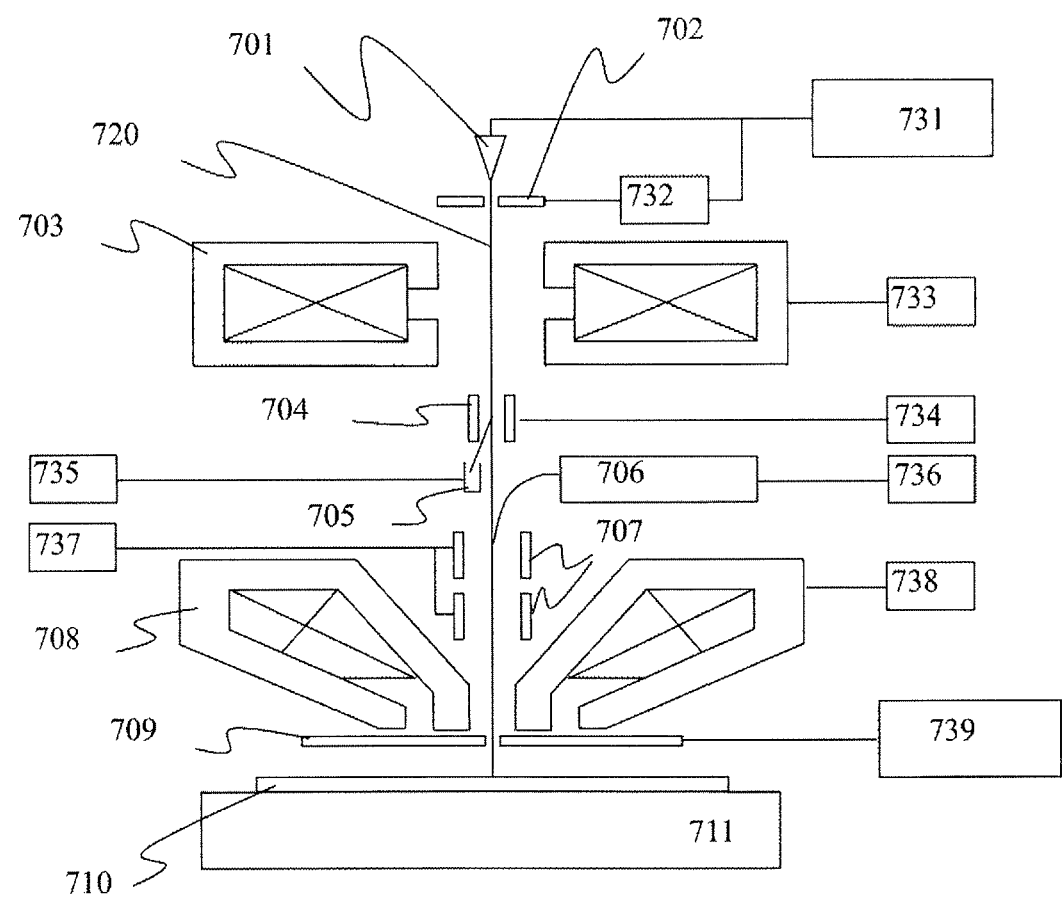
[Fig. 7]

[Fig. 8]
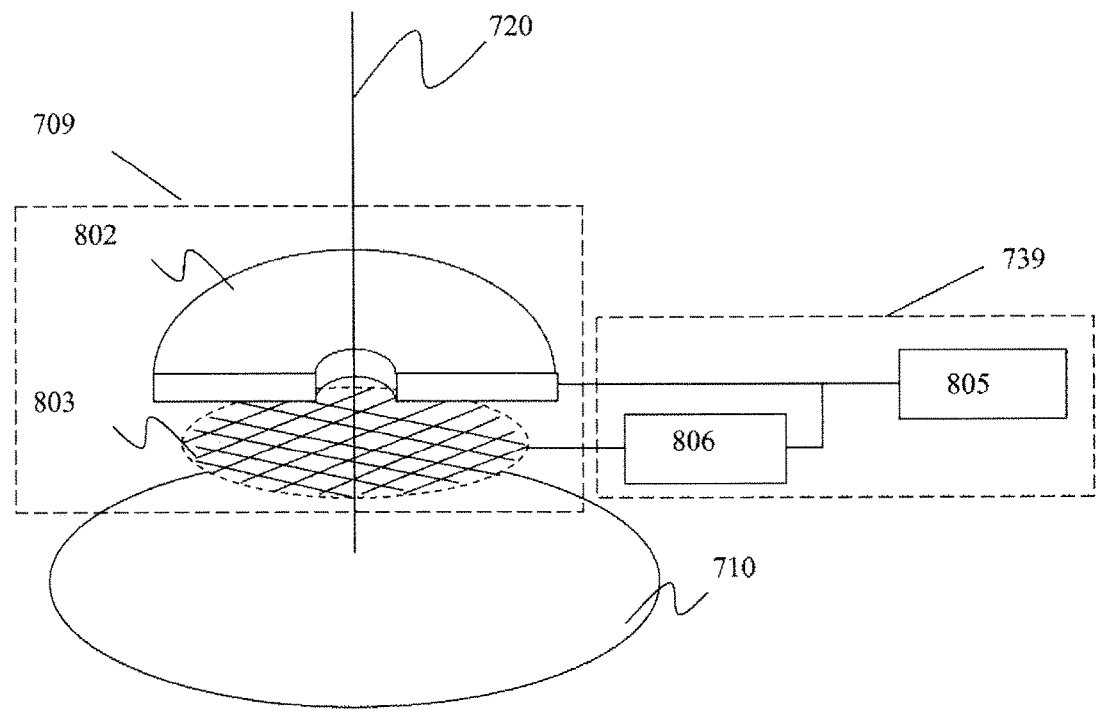
[Fig. 9]
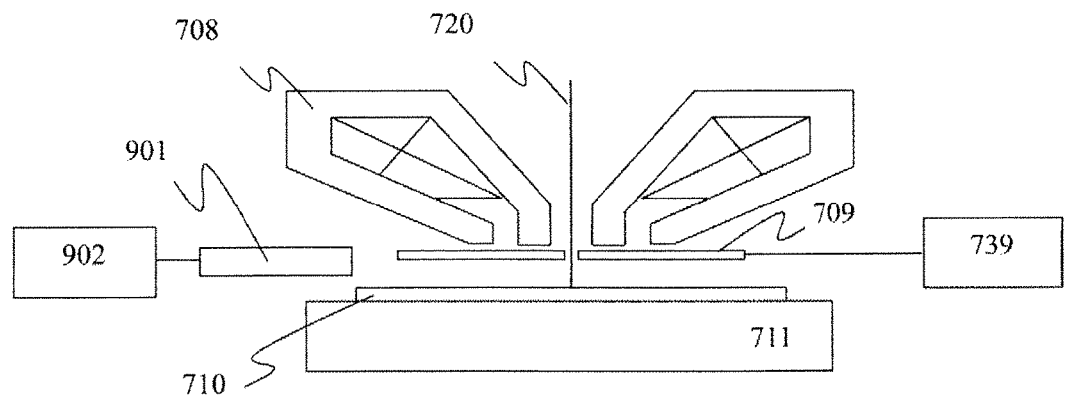

[Fig. 10]
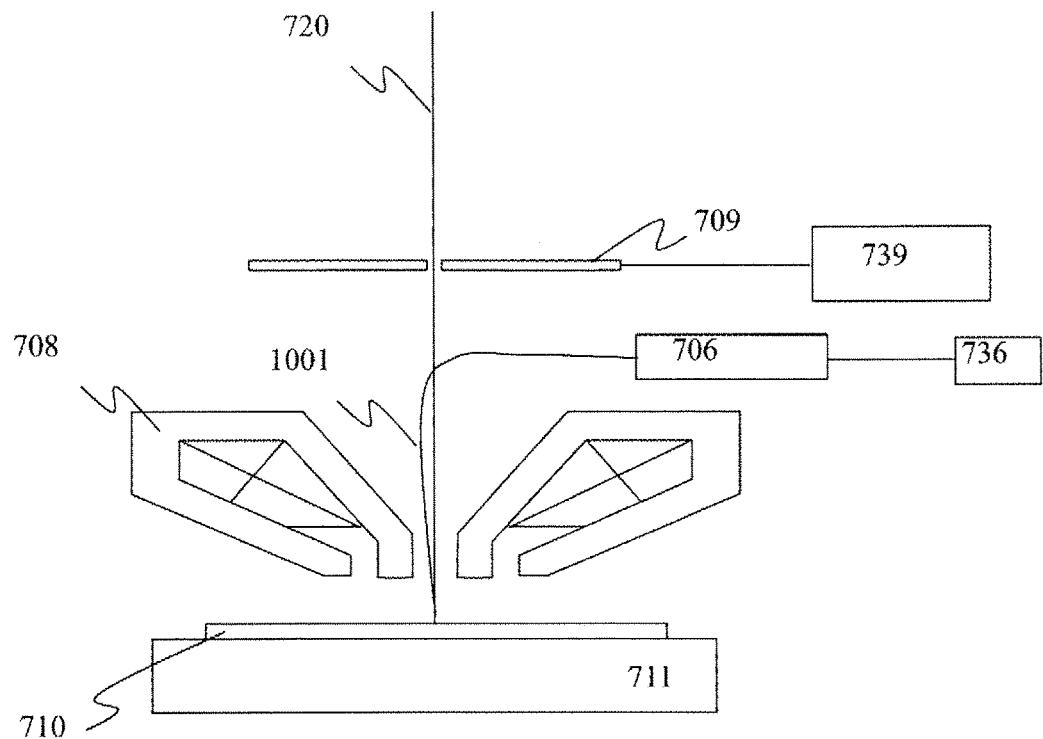
[Fig. 11]
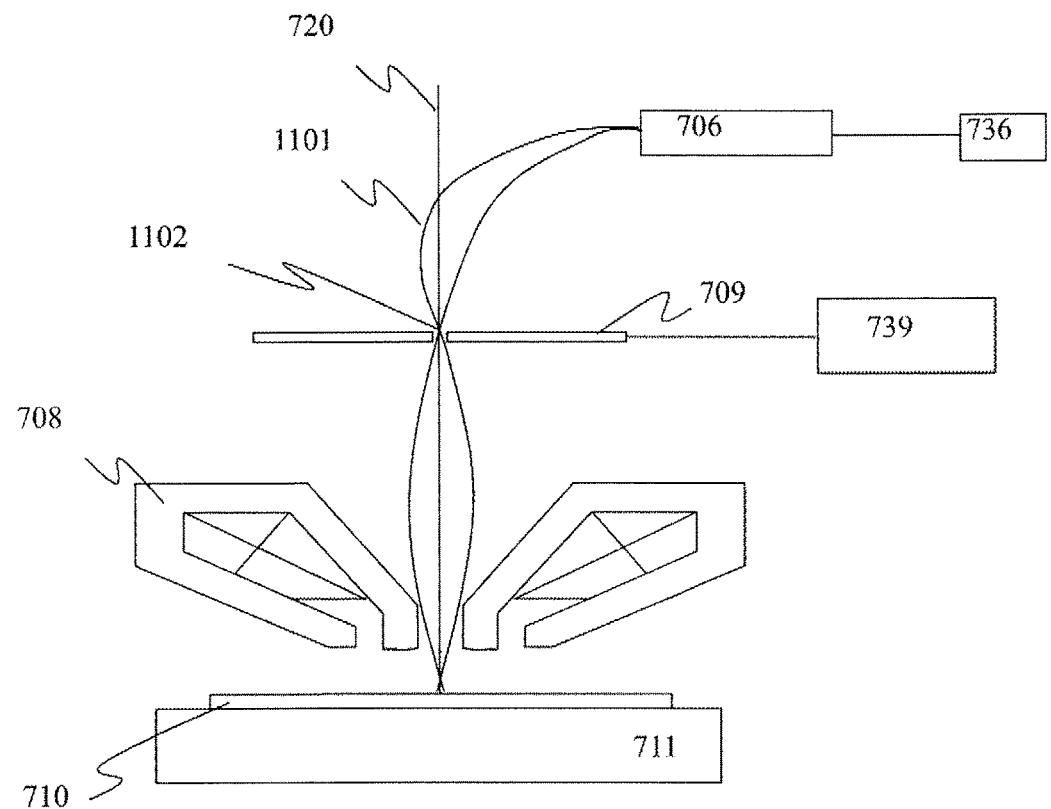

[Fig. 12]
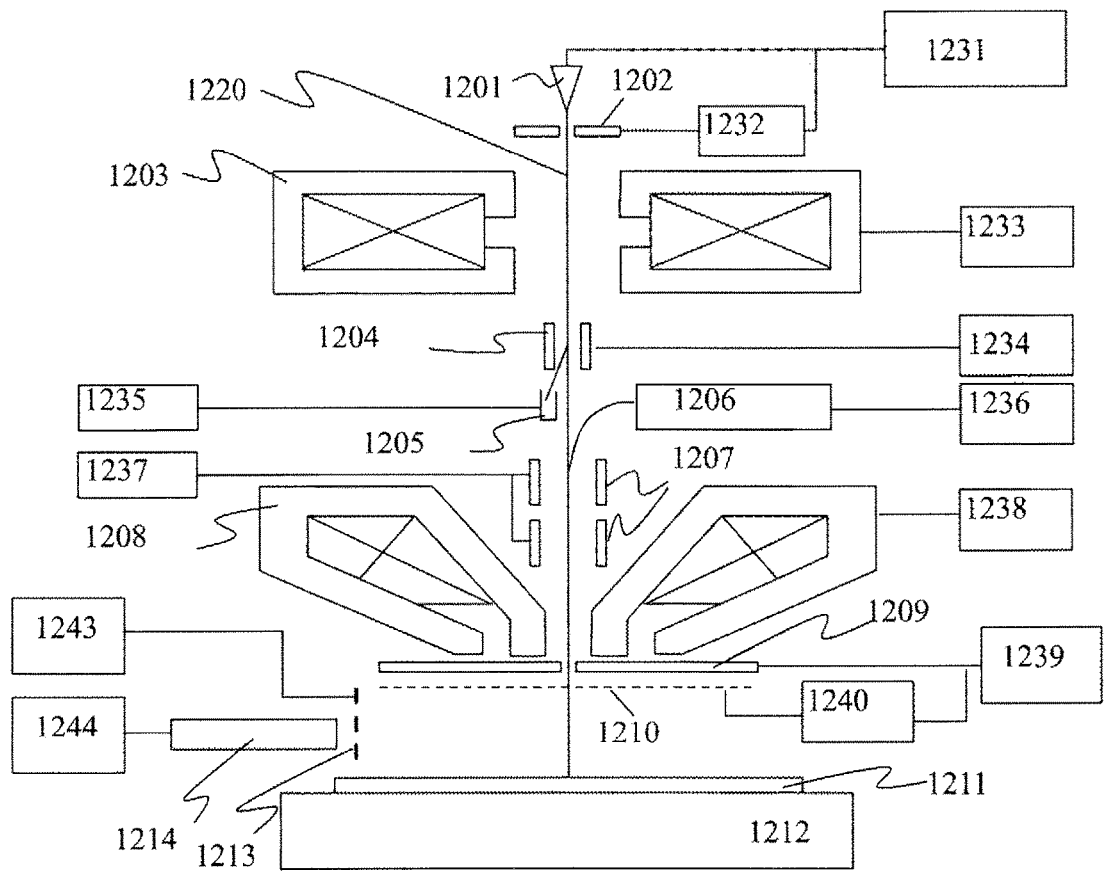
[Fig. 13]
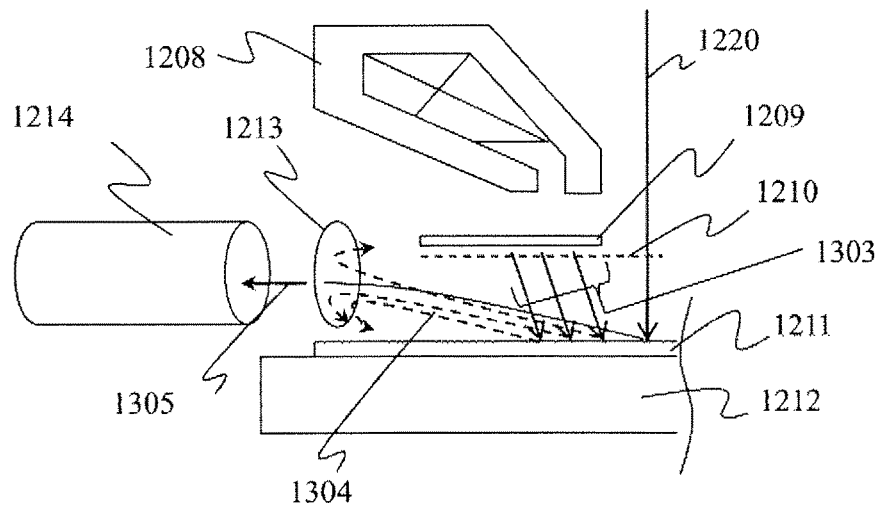

[Fig. 14]
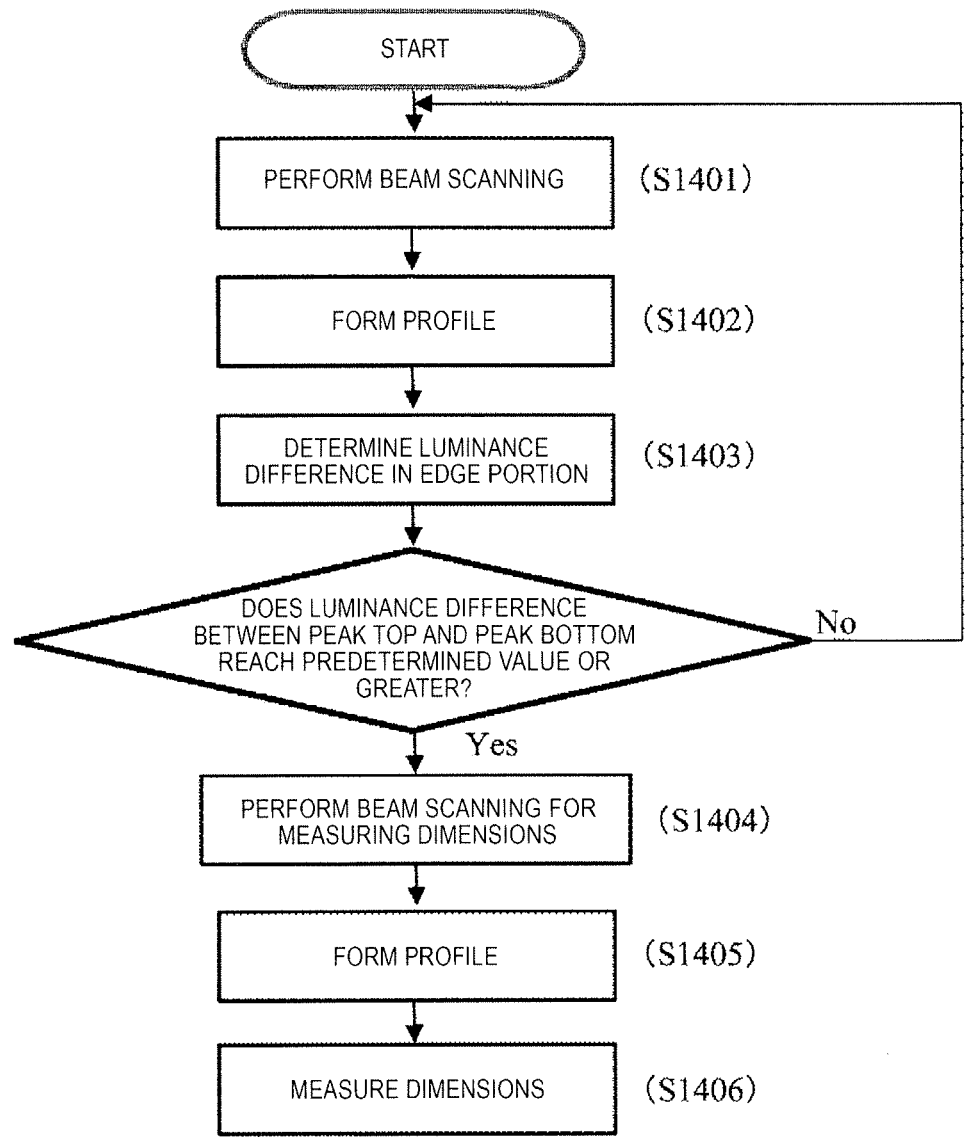

[Fig. 15]

Pre-scan Beam Condition

| | |
|---|---|
| Pattern | Polymer A-B ▽ — 1501 |
| Pre-scan mode | Voltage Contrast<br>C/H Observation — 1502<br>Edge Enhancement |
| Location | |
| FOV size | |
| Exposure Time | |
| Beam Current | |
| Landing Energy | |
| Frame | |

Apply

[Fig. 16]

| E/E | | | | |
|---|---|---|---|---|
| Pattern Name | Exposure time | Beam Current | Beam Energy | |
| | | | | |
| | | | | |
| | | | | |
| | | | | |
| | | | | |
| | | | | |

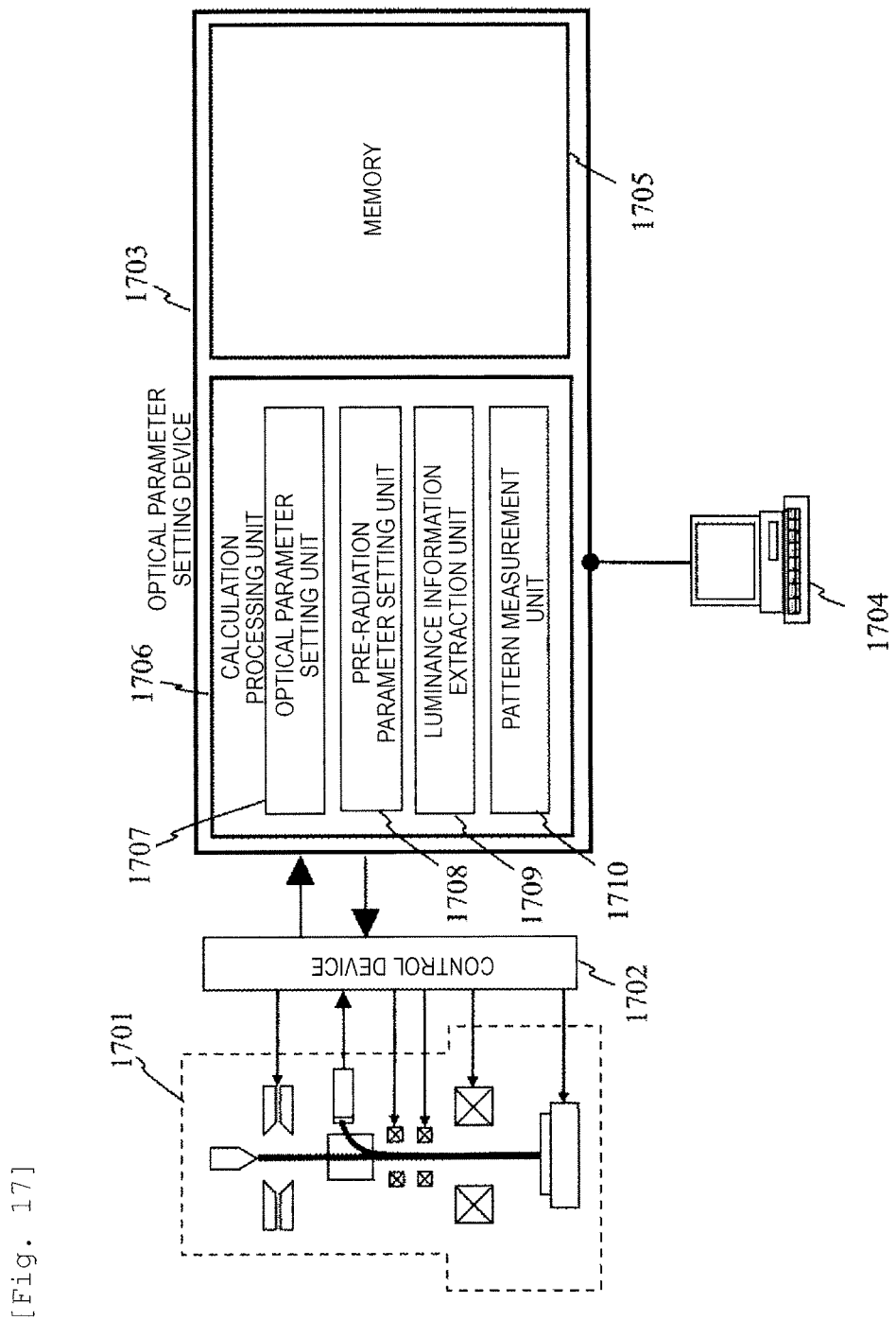
[Fig. 17]

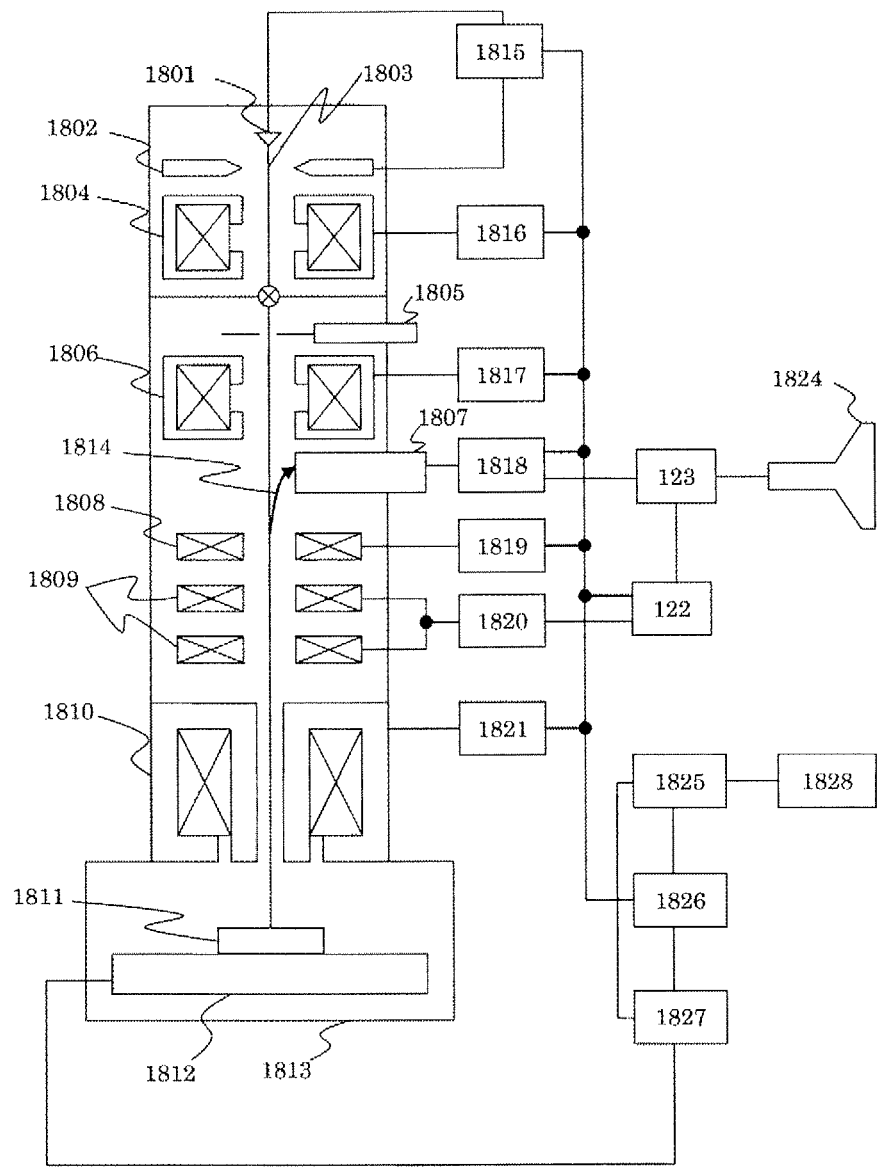
[Fig. 18]

[Fig. 19]
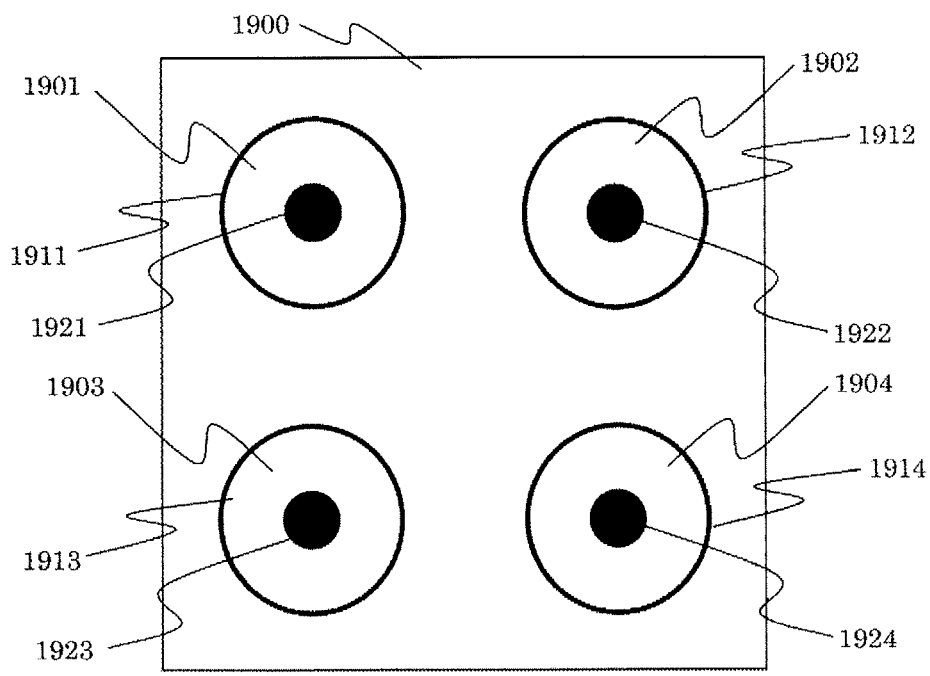

[Fig. 20]
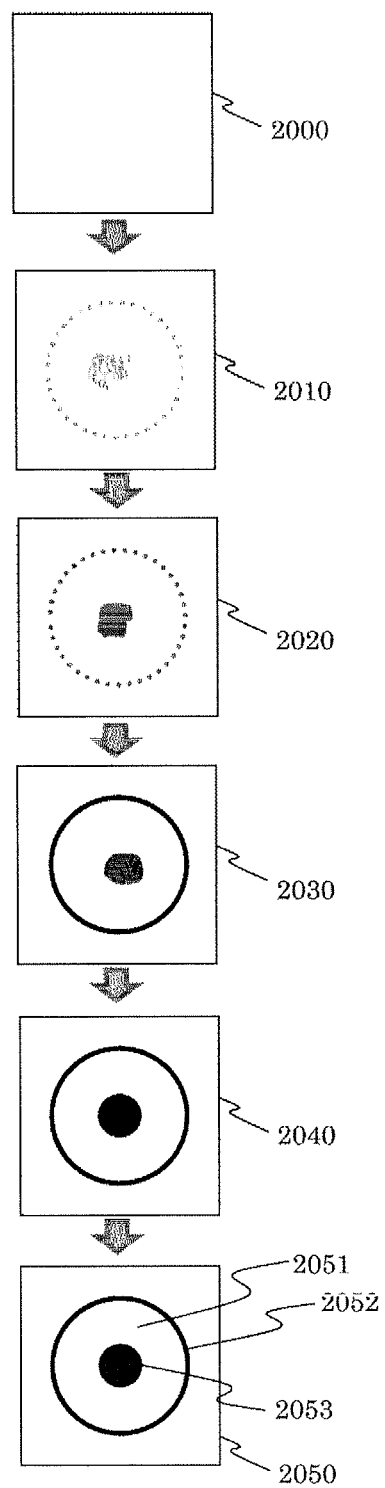

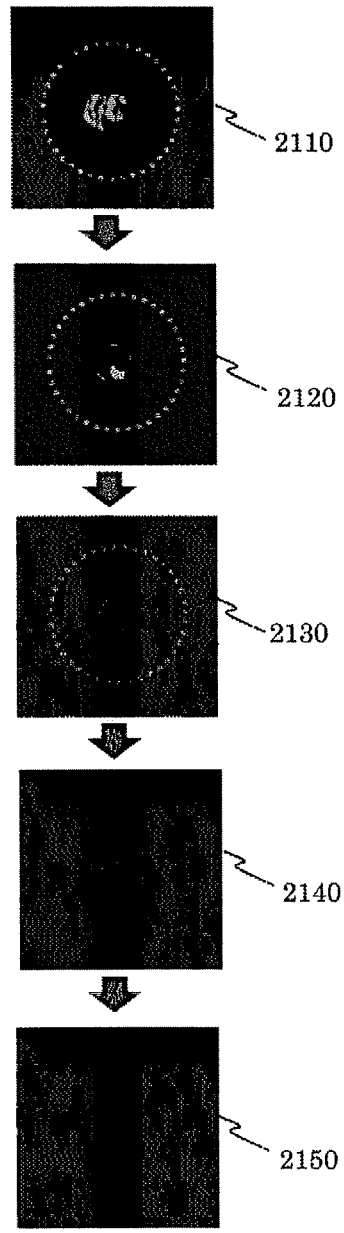
[Fig. 21]

[Fig. 22]
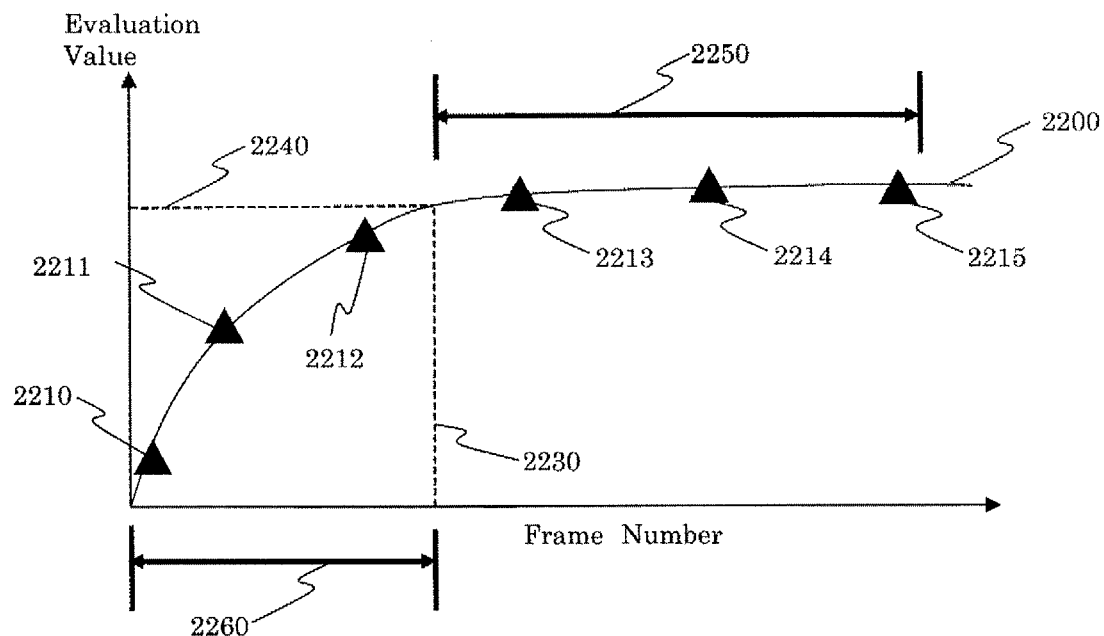
[Fig. 23]
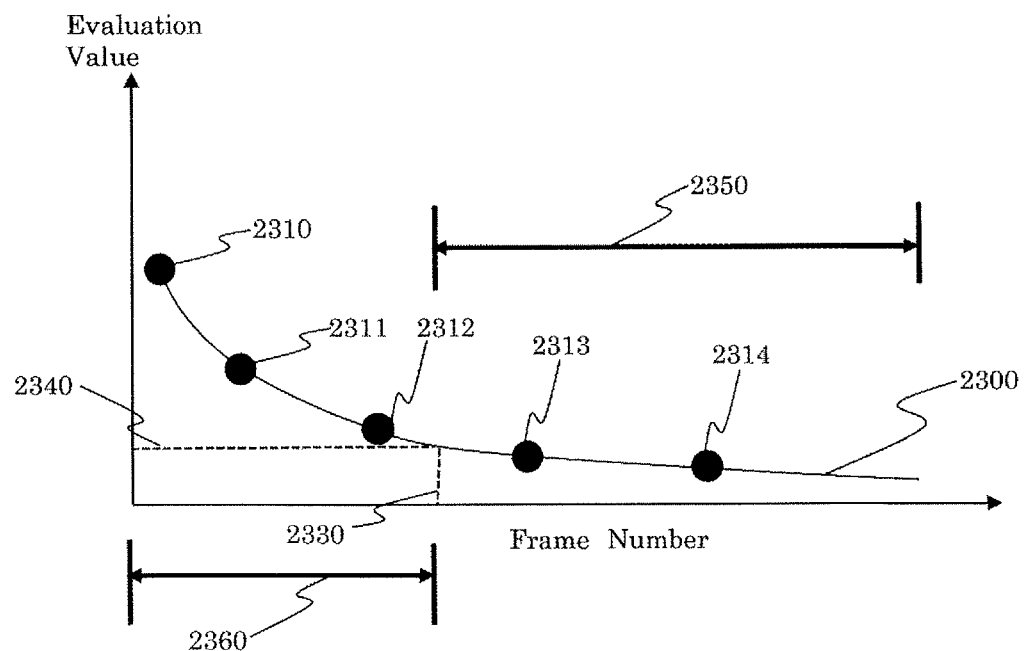

[Fig. 24]
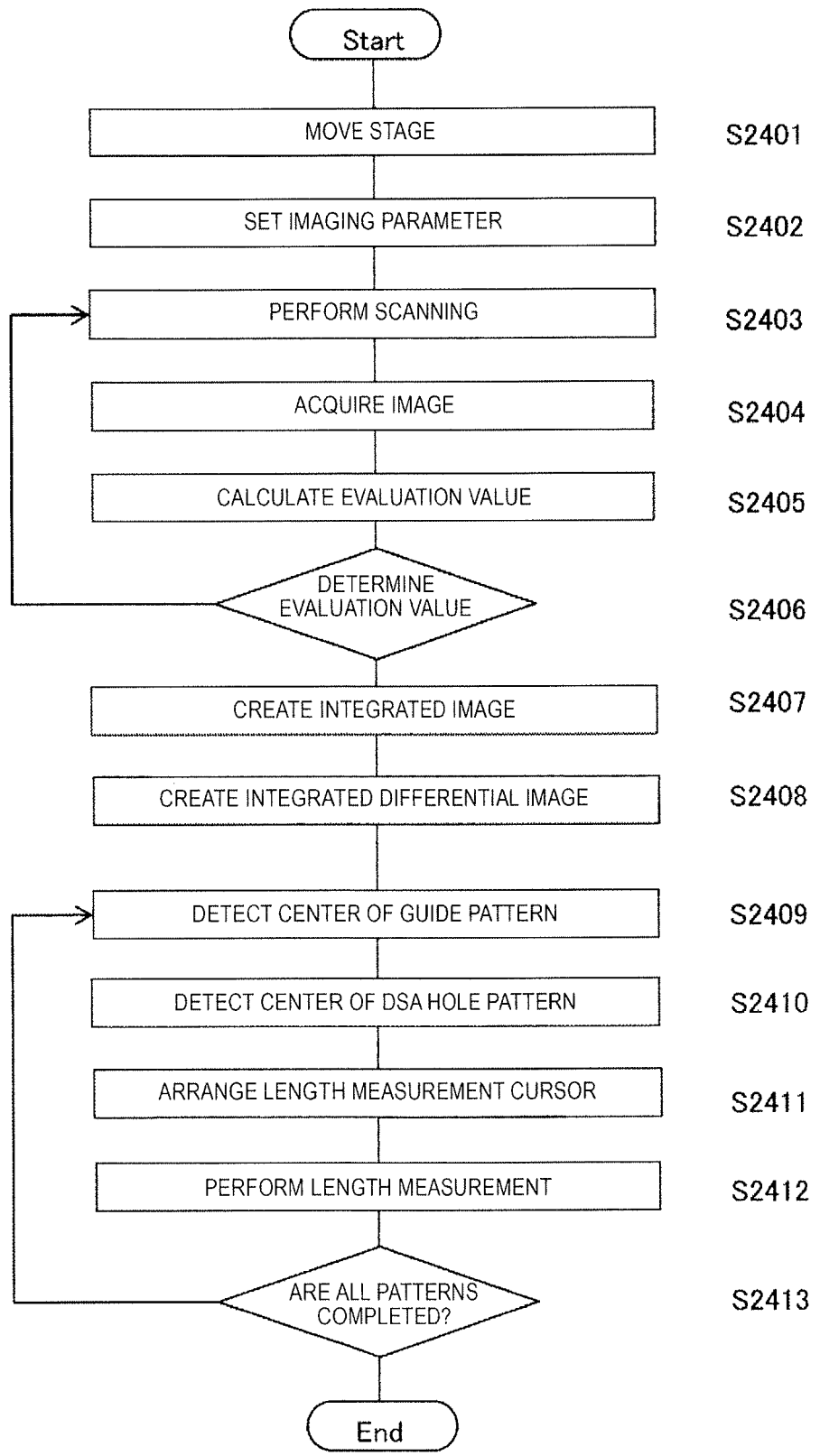

[Fig. 25]
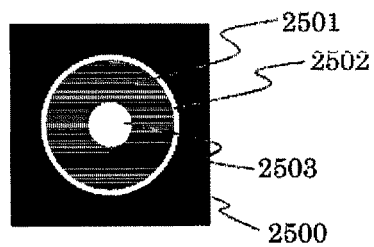
[Fig. 26]
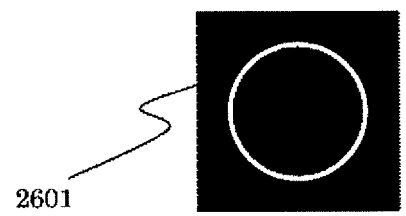
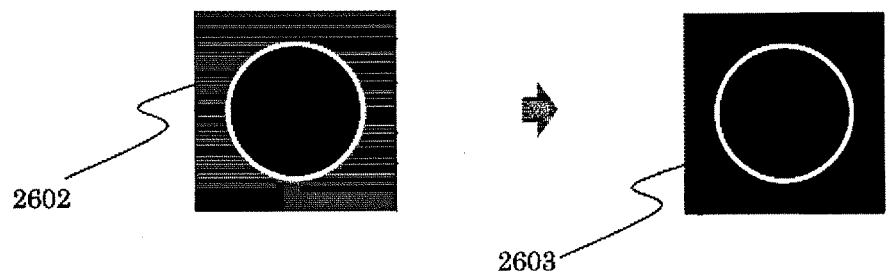

[Fig. 27]
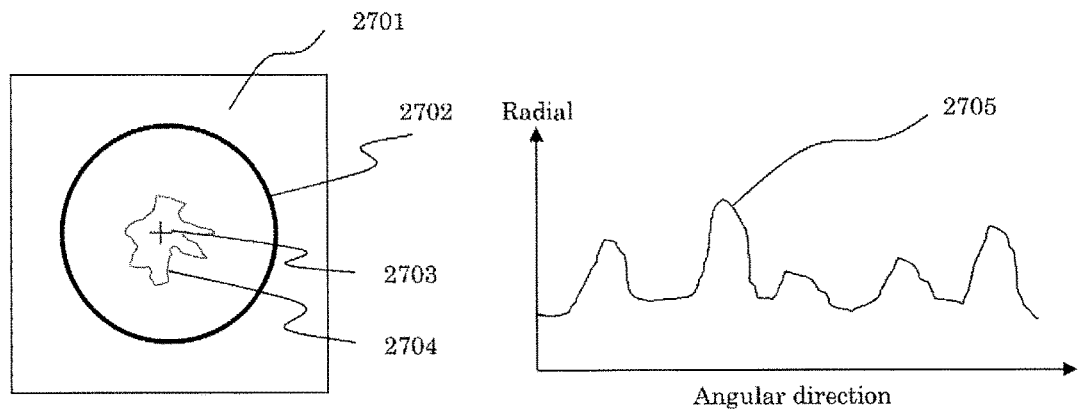
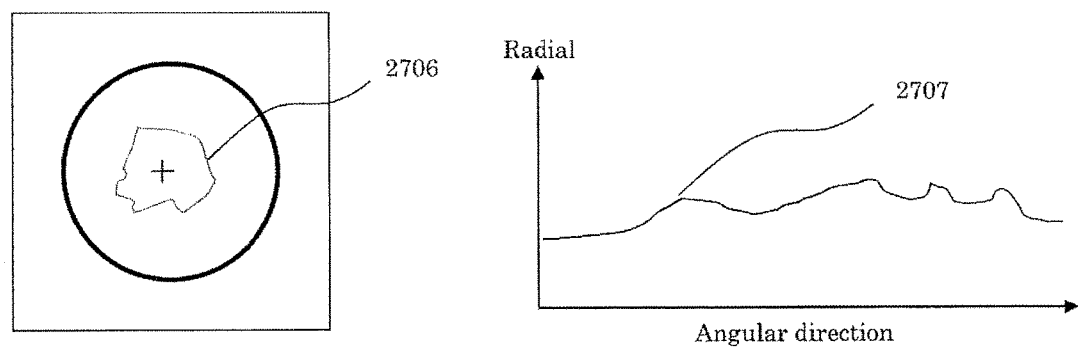
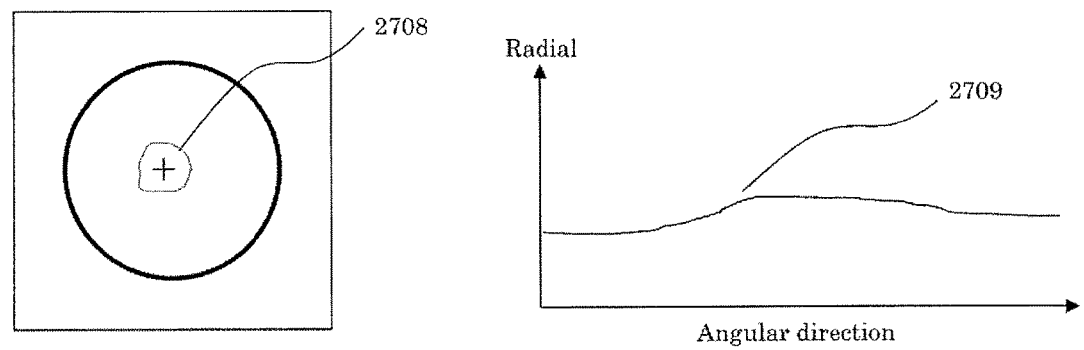

[Fig. 28]
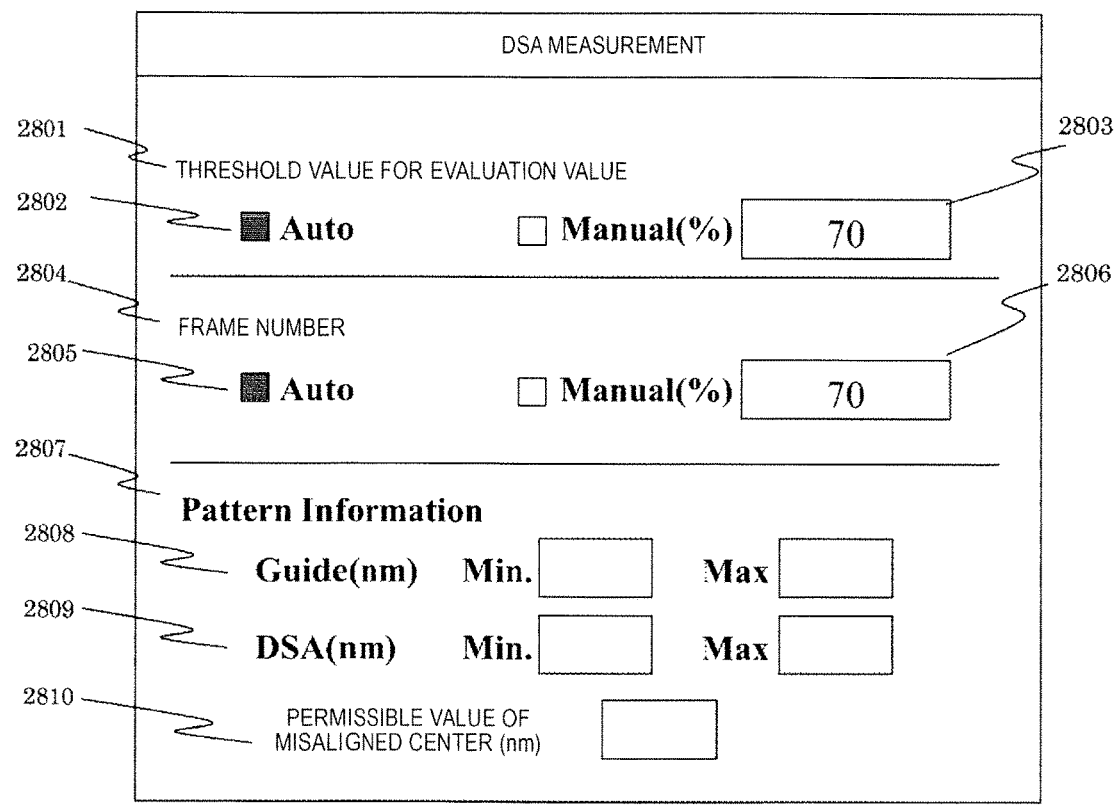

METHOD FOR PATTERN MEASUREMENT, METHOD FOR SETTING DEVICE PARAMETERS OF CHARGED PARTICLE RADIATION DEVICE, AND CHARGED PARTICLE RADIATION DEVICE

TECHNICAL FIELD

The present invention relates to a method for pattern measurement and a charged particle radiation device, and particularly relates to a method for pattern measurement and a charged particle radiation device which are suitable for measuring a polymer compound used in self-organization lithography.

BACKGROUND ART

In order to generate fine patterns for recent semiconductor devices, a method has been studied in which etching mask patterns are formed by using a directed self-assembly (DSA) method. The DSA method utilizes self-aligning properties of a composite polymer material in which two types of polymers are connected to or mixed with each other. PTL 1 discloses an example in which patterns formed by means of the DSA technique are observed through a scanning electron microscope, and an example in which dimensions of the patterns are measured.

It is expected that the charged particle radiation device which is represented by the scanning electron microscope (SEM) and which can measure or inspect fine patterns plays an important role in developing the DSA technique. PTLS 2 and 3 disclose a method for observing a sample after charging the sample and actualizing characteristics of the sample.

In addition, PTL 42 discloses a method in which an image is formed by integrating multiple image data items when pattern measurement is performed using an electron microscope, and in which the number of integration target frames is automatically determined based on determination of whether or not pattern recognition is possible.

CITATION LIST

Patent Literature

PTL 1: JP-A-2010-269304 (corresponding U.S. Pat. No. 8,114,306)
PTL 2: JP-A-10-313027 (corresponding U.S. Pat. No. 6,091,249)
PTL 3: JP-A-2006-234789 (corresponding U.S. Pat. No. 7,683,319)
PTL 4: JP-A-2010-092949 (corresponding US Patent Application No. US2011/0194778)

SUMMARY OF INVENTION

Technical Problem

According to a DSA technique, a polymer compound is applied onto a wafer so as to fill a portion between fine patterns formed by means of a general lithography method with the polymer compound in which multiple types of polymers are chemically bonded to one another, and the polymers are subjected to phase separation through thermal processing, thereby forming patterns. The DSA technique enables fine patterning which exceeds limits of reduced exposure caused by an optical proximity effect. However, since the polymer compound has a flat surface after the thermal processing, in some cases, contrast cannot be sufficiently obtained in a case of the scanning electron microscope for detecting secondary electrons which are generated mainly by an edge effect. PTL 1 discloses that the patterns formed by means of the DSA technique are observed using the electron microscope, but does not disclose a specific method for determining how to improve the contrast. In addition, PTLS 2 and 3 do not disclose whether or not the patterns formed by means of the DSA technique are observation targets.

Hereinafter, a method for pattern measurement and a charged particle radiation device will be described whose first object is to very precisely measure or inspect patterns formed by means of the DSA technique by using a high contrast image or signal.

In addition, if a block copolymer or a blended polymer is applied onto and annealed in a hole pattern serving as a guide formed on a substrate by means of optical lithography and etching, the polymer is separated into a cylindrical shape due to an induction organization phenomenon. Thereafter, one polymer is removed due to the phenomenon, and hole patterning is completed after an etching process.

On the other hand, when the pattern separated by the annealing is measured using the electron microscope, it is difficult to detect and measure a measurable pattern edge since there are almost no irregularities in the pattern in a state where the induction organization is completed by the block copolymer or the blended polymer. In addition, it is also difficult to set a proper measurement range or radiation time. In particular, in a semiconductor manufacturing process, the charged particle radiation device for evaluating a workmanship of the pattern needs to determine device parameters in advance. PTL 1 does not specifically disclose how to determine such device parameters. In addition, PTL 4 discloses a method for automatically determining the frame number in integration target image data, but does not disclose specific solving means such as how to set the device parameters when the pattern having almost no irregularities is measured.

On the other hand, the present inventors have confirmed a phenomenon in which a specific polymer is contracted by radiating a charged particle beam. In general, among the multiple separated polymers, the polymer contracted by irradiating the beam is a polymer to be removed due to the phenomenon. Accordingly, if beam parameters are properly set, very precise measurement is possible for a pattern having irregularities as a measurement target without causing substantial damage to a sample.

Hereinafter, a method for setting device parameters in a charged particle radiation device and a charged particle radiation device will be described whose second object is to very precisely perform pattern measurement or inspection based on the setting of proper device parameters, even when there are no irregularities as in a DSA pattern, or even when a pattern is less likely to be measured or inspected by scanning of a charged particle beam using an edge effect.

Solution to Problem

According to an aspect for achieving the above-described first object, a method for pattern measurement or a charged particle radiation device for realizing the measurement is proposed as follows. A charged particle is radiated to a polymer compound used for a self-organization lithography technique, and a specific polymer is considerably contracted as compared to the other polymer among multiple polymers forming the polymer compound. Thereafter, or concurrently with the contraction, dimensions between multiple edges of the other polymer are measured, based on a signal obtained by scanning a region including the other polymer with the charged particle beam.

Furthermore, according to another aspect for achieving the above-described second object, a method for setting device parameters of a charged particle radiation device is proposed as follows. In the method for setting device parameters in the charged particle radiation device, scanning parameters are set for a charged particle beam when an image is formed, based on a charged particle obtained by scanning a polymer compound used for a self-organization lithography technique with the charged particle beam. The polymer compound is scanned with the charged particle beam, and an image obtained based on the scanning is evaluated. The scanning with the charged particle beam and the evaluation of the image are repeatedly performed until a result of the evaluation satisfies predetermined parameters. The scanning parameters obtained when the image satisfies the predetermined parameters are set as the scanning parameters of the charged particle beam before scanning is started in order to acquire images for integration.

In addition, a charged particle radiation device is proposed as follows. The charged particle radiation device includes: a scanning deflector that performs scanning with a charged particle beam discharged from a charged particle source; a detector that detects the charged particle obtained by scanning a sample with the charged particle beam; and a control device that forms an image by integrating an output from the detector. The control device evaluates an image obtained based on scanning with the charged particle beam. The scanning with the charged particle beam and the evaluation of the image are repeatedly performed until a result of the evaluation satisfies predetermined parameters, and the scanning parameters obtained when the result of the evaluation satisfies the predetermined parameters are set as the scanning parameters of the charged particle beam before scanning is started in order to acquire images for integration.

The above-described radiation parameters are used in order to contract a specific polymer before acquiring an image signal used in forming an image for performing measurement or inspection, for example. After the specific polymer is contracted, beam scanning or image acquisition for the measurement or the inspection is performed.

Advantageous Effects of Invention

According to the above-described first configuration, even in a case of a polymer compound whose surface is flat and in which multiple polymers are bonded to one another, it is possible to perform very precise measurement using a high contrast signal.

In addition, according to the above-described second configuration, even in a case of a pattern which has no irregularities as in a DSA pattern and which is less likely to be measured or inspected by scanning of a charged particle beam using an edge effect, it is possible to very precisely measure or inspect the pattern, based on the setting of proper device parameters.

BRIEF DESCRIPTION OF DRAWINGS

FIGS. 1A-1D are views illustrating an example of a pattern created using a DSA method.

FIG. 2 is a view illustrating a schematic configuration of a scanning electron microscope.

FIGS. 3A-3C are views illustrating a relationship between a cross section of a DSA pattern and an SEM image.

FIGS. 4A-4C are views illustrating a relationship between the cross section of the DSA pattern and the SEM image formed based on an output from an oblique detector.

FIG. 5 is a view illustrating four oblique detectors.

FIG. 6 is a view illustrating the oblique detector having a detection element divided into four elements.

FIG. 7 is a view illustrating an example of the scanning electron microscope including an electron source for processing.

FIG. 8 is a view illustrating an example of a planar electron source.

FIG. 9 is a view illustrating an arrangement example of the planar electron source.

FIG. 10 is a view illustrating an arrangement example of the planar electron source.

FIG. 11 is a view illustrating an arrangement example of the planar electron source.

FIG. 12 is a view illustrating an example of the scanning electron microscope including the planar electron source.

FIG. 13 is a view illustrating an electron trajectory when a processing beam is radiated.

FIG. 14 is a flowchart illustrating processes from DSA pattern processing to DSA pattern measurement.

FIG. 15 is a view illustrating an example of a GUI screen for setting pre-radiation parameters.

FIG. 16 is a view illustrating a table example for storing the pre-radiation parameters in accordance with a type of patterns created for each pre-radiation purpose.

FIG. 17 is a view illustrating an example of a pattern dimension measurement system including the scanning electron microscope.

FIG. 18 is a view illustrating a schematic configuration of the scanning electron microscope.

FIG. 19 is a view illustrating an example of a DSA hole pattern image having a guide pattern.

FIG. 20 illustrates a frame image showing how the guide pattern and the DSA hole pattern are imaged when an electron beam is radiated.

FIG. 21 is a view illustrating a differential image between preceding and trailing frame images.

FIG. 22 is a graph in which an evaluation value obtained from a frame image group in FIG. 20 is plotted.

FIG. 23 is a graph in which an evaluation value obtained from a differential image group in FIG. 21 is plotted.

FIG. 24 is a flowchart illustrating a measurement process using an integrated image.

FIG. 25 is a view illustrating an image example in which the differential image is integrated.

FIG. 26 is a view for describing a method for detecting a hole pattern center using a template.

FIG. 27 is a view for describing a method for detecting the guide pattern.

FIG. 28 is a view illustrating an example of the GUI screen for inputting measurement parameters.

DESCRIPTION OF EMBODIMENTS

FIG. 1 schematically illustrates a fine pattern using a DSA method. FIG. 1(a) illustrates a silicon wafer 101 serving as a substrate for generating the pattern. Referring to FIG. 1(b), a wide pitch pattern 102 which is wider than a repetitive pitch of a desired fine pattern is generated on the silicon wafer 101 by using a lithography technique. Referring to FIG. 1(c), thereafter, a composite polymer material 110 is applied. Proper thermal processing (annealing) causes the composite polymer material 110 to be guided by the pattern 102 and to be self-aligned in a specific direction. The composite polymer material 110 is configured so that two different types of a polymer 111 and a polymer 112 are repetitively arranged. Referring to FIG. 1(*d*), it is possible to generate a narrow pitch pattern 103 which is narrower than the guide pattern 102 by selecting and removing one polymer (for example, the polymer 112).

It is important to determine whether or not phase separation is properly performed after thermal processing and before etching, since it can be quickly determined whether or not a proper polymer material is selected or whether annealing parameters are properly set. However, as illustrated in FIG. 1(*c*), the polymer material has a flat surface regardless of multiple polymers contained in the polymer material. Consequently, a scanning electron microscope cannot obtain an image showing high contrast. Based on the above-described circumstances, the present inventors have newly found out that one configuration to be provided for the SEM for inspecting and measuring the DSA pattern is surface processing for enhancing the contrast. In the pattern measurement or inspection, it is important to detect a defective pattern as soon as possible in order to reduce temporal and economic costs. Accordingly, it is preferable to perform the measurement or the inspection at a step in FIG. 1(*c*) without passing through a step in FIG. 1(*d*). In this state, there is no height difference between the polymer 111 and the polymer 112, and thus normal SEM observation is difficult. Furthermore, there is no significant difference in mass density between the polymer 111 and the polymer 112, and it is not possible to obtain contrast using the difference in the mass density. In addition, in many cases, electrical characteristics of the polymer 111 and the polymer 112 indicate that both are insulators. Consequently, it is not possible to obtain voltage contrast using a charged potential difference.

According to embodiments described herein, there are provided a method and a device thereof in which observation is performed after a charged particle beam is radiated to an observation target area in advance in order to observe a narrow pitch pattern generated using a DSA method. It is possible to decrease a volume of any one polymer between a pair of polymers (polymers 111 and 112 in FIG. 1) by radiating the charged particle beam to the observation target area in advance. This method enables a step difference corresponding to a pattern shape to be formed on a polymer surface. Accordingly, it is possible to perform very precise measurement and inspection. In addition, according to an aspect of the present invention, the charged particle beam radiated to the observation target area in advance is the same as the charged particle beam used for observation subsequent thereto.

Embodiment 1

An example of the scanning electron microscope which can perform high contrast signal measurement for the DSA pattern, based on a high contrast signal will be described with reference to the drawings. FIG. 2 illustrates a schematic view of the scanning electron microscope (SEM). An electron source 201 is held at a negative potential with respect to a sample by a control power source 231. An extraction electrode 202 is set to be located at a further positive potential from the electron source 201 by a positive voltage power source 232 superimposed on the control power source 231, thereby extracting an electron beam 220. The electron beam 220 is radiated onto an observation target sample 210 through a focusing lens 203 and an objective lens 208. A diameter of the electron beam 220 radiated onto the observation target sample 210 is properly controlled by lens control circuits 233 and 238. In addition, a current amount of the electron beam 220 is detected by a Faraday cup 205, and is measured by current measurement means 235. The electron beam 220 is radiated in order to scan an observation target field by a deflector 207 operated by a deflection control circuit 237. When the electron beam 220 is moved rearward away from the sample 210, a beam blanker 204 is operated by using a beam blanker power source 234. A signal electron generated from the sample 210 is detected by an in-lens detector 206 installed on the further electron source 201 side from the objective lens 208, or by an oblique detector 209 installed in a specific direction. The in-lens detector efficiently detects a slow signal electron radiated from the sample in various directions, thereby functioning as a detector suitable for acquiring an edge contrast image which enhances an edge portion having a surface step difference. In contrast, the oblique detector 209 is suitable for detecting a signal electron which is radiated in the specific direction of the sample and which has high energy.

In order to observe a pattern created using the DSA method, the observation target sample 210 is placed on a sample stage 211, and is conveyed to below the objective lens 208. An observation target site is scanned in advance using the electron beam 220, and a volume of one polymer is decreased, thereby forming a surface step difference. This process is called radiation for processing. Thereafter, the observation target site is scanned again using the electron beam 220, and a signal of the in-lens detector 206 is imaged by a signal processing device 236 so as to obtain a microscopic image. If the radiation for processing is sufficient at this time, a step difference is formed in an edge portion of the pattern formed using the DSA method, and clear edge contrast appears at the boundary between the two different polymers on the obtained microscopic image. If this edge line is used, it is possible to perform very precise measurement of pattern dimensions on the observation target sample, or defect inspection of a pattern shape on the observation target sample.

The charged particle is radiated to the polymer compound used for the self-organization lithography technique, and a specific polymer is considerably contracted as compared to the other polymer among multiple polymers forming the polymer compound. Thereafter, dimensions between multiple edges of the other polymer are measured, based on a signal obtained by scanning of the charged particle beam on a region including the other polymer. According to this configuration, it is possible to quickly perform very precise evaluation on the DSA pattern.

FIG. 17 is a view illustrating an example of a pattern measurement system including an SEM 1701. The system is configured to include the SEM 1701, a control device 1702 for controlling the SEM 1701, an optical parameter setting device 1703 for setting desired device parameters in the control device 1702, and a setting device 1704 for setting measurement parameters using the SEM. A display device disposed in the setting device 1704 can display a graphical user interface (GUI) screen as illustrated in FIG. 15. The GUI screen illustrated in FIG. 15 has an input window 1501 for inputting a type of the pattern and an input window 1502 for inputting beam radiation parameters before beam scanning for measurement starts. In a case of the present embodiment, a pre-scanning mode can be selected from three modes of voltage contrast, contact hole (C/H) observation, and edge enhancement in which an edge of the other polymer is enhanced by decreasing a volume of one polymer as described above.

When the pre-scanning is performed in the voltage contrast mode, beam scanning is performed depending on beam conditions for charging elements included in a field of view (first scanning mode). When the pre-scanning is performed in the contact hole observation mode, beam scanning is performed in order to positively charge a resist on a sample surface (second scanning mode). Then, when the pre-scanning is performed in the edge enhancement mode, beam scanning is performed in order to decrease the volume of one polymer (third scanning mode).

Among the three scanning modes, only the third scanning mode is not intended to charge the sample. In the present embodiment, the GUI screen having a window disposed in order to set pre-radiation parameters for measuring this DSA pattern will be described.

As described above, there are various types of pre-scanning, and the beam conditions are different from each other. Accordingly, as illustrated in FIG. 16, a database for storing the beam conditions is prepared for each type of the patterns. If beam parameters are read from the database based on the type of the patterns and selection of the scanning mode, it becomes easy to select the pre-scanning parameters. In addition, if this database is prepared so as to update parameters when an unknown sample is measured, it is possible to easily set the previously used setting parameters. A field of view (FOV), an exposure time, a beam current, landing energy of the beam to the sample, the frame number, the type of patterns, or the pre-scanning mode, all of which will be used during the pre-scanning, may be selected from the GUI screen illustrated in FIG. 15. In this manner, the database illustrated in FIG. 16 may be updated.

The database is registered in a memory 1705 incorporated in the optical parameter setting device 1703, and is set as optical parameters of the SEM 1701 by the setting device 1704. A calculation processing unit 1706 disposed inside the optical parameter setting device 1703 includes an optical parameter setting unit 1707 which sets the beam parameters for measurement, a pre-radiation parameter setting unit 1708 which sets the pre-scanning parameters based on the database registered in the memory 1705 or the setting parameters set by the setting device 1704, a luminance parameter extraction unit 1709 which obtains parameters for stopping the pre-radiation (to be described later), and a pattern measurement unit 1710 which measures dimensions of the pattern by forming a profile waveform based on the beam scanning for measurement.

According to the above-described configuration, it is possible to perform very precise measurement using an edge which is actualized based on the processing.

FIG. 3 is a view illustrating a relationship between a cross section of the DSA pattern and the SEM image. FIG. 3(a) illustrates the DSA pattern and the SEM image before radiation for processing is performed. There is no contrast in the SEM image in response to no surface step difference between the two different polymers 301 and 302. FIG. 3(b) illustrates a case where the volume of the polymer 302 is decreased by beam radiation. Many signal electrons are generated from a side wall of the polymer 301 whose volume is not decreased, thereby forming a clear strong signal area (white band) 303 at the boundary between the polymer 301 and the polymer 302. This enables the measurement and inspection of the DSA pattern. FIG. 3(c) illustrates a case where a method according to the present invention is employed, but the volume is insufficiently decreased. In this case, an amount of the signal electron generated from the side wall of the polymer 301 is insufficient, and thus a white band 304 is also weak. More specifically, an enlarged view of the pattern in FIG. 3 shows that as compared to an edge 305 in contact with a portion which is not filled with the first end polymer 302, a signal of the insufficiently processed pattern edge 304 is weaker than the white band 303 of the sufficiently processed pattern edge.

In particular, in a case of an unknown sample, in order to sufficiently ensure measurement accuracy, it is desirable to employ a method for determining whether or not the radiation for processing is sufficient.

FIG. 14 is a flowchart illustrating processes from processing to measurement. The following processes are performed by the control device 1702 controlling the SEM 1701 based on the setting parameters set by the optical parameter setting device 1703. First, beam scanning is performed in order to perform the processing and to check whether or not the processing is properly performed (Step 1401). A profile for monitoring a processing state is formed (Step 1402). Here, a luminance difference between a peak top and a peak bottom is determined by monitoring luminance in the edge portion (Step 1403). Here, if the value is smaller than a predetermined value, the process returns to Step 1401. If the value is the predetermined value or greater, beam scanning for measuring dimensions is performed (Step S1404). A profile is formed based on the charged particle obtained as a result of the beam scanning in Step 1404 (Step 1405). The dimension measurement for the pattern using the formed profile is performed (Step S1406).

Unlike a case where a specific element is selectively charged, luminance signals of the edge and the other portion become relatively different from each other as the pre-radiation progresses. Accordingly, it is possible to determine a proper completion point of the processing by evaluating a transitional state of the relative difference between the edge portion and the other portion. In addition, instead of the comparison between peak heights, luminance information may be obtained by evaluating a change in peak widths, for example. It is possible to very precisely measure the dimensions by causing the profile formed for measuring the dimensions not to include a profile signal for monitoring the processing.

As will be described later, when charged particle detection for monitoring the processing and charged particle detection for measuring the pattern dimensions are concurrently performed, a signal obtained after the processing is completed may be selectively used when the profile for measurement is formed, or an output signal may be received from a detector after the processing is completed.

FIG. 4 is a view illustrating an image formed based on the charged particle detected by the oblique detector 209 in which the same observation target as that in FIG. 3 is arranged in an oblique direction to the beam optical axis. In the image obtained by the oblique detector 209, a sample tilting surface whose normal direction is oriented in the detector direction is brightly imaged, and a sample surface whose normal direction is oriented in the direction opposite to the detector is darkly imaged. In other words, an edge having a section facing the detector side becomes bright, and an edge having a section facing the side opposite to the detector becomes dark.

FIG. 4a illustrates the SEM image of the DSA pattern before the processing beam is radiated. Since there is no step difference between two different types of polymers 401 and 402, there is no contrast even in a case of the SEM image obtained based on the detection of the oblique detector. FIGS. 4b and 4c illustrate the SEM image obtained when a volume of the polymer 402 is decreased by the beam radiation processing.

Within a side wall of the polymer 401 whose volume is not decreased, a side wall portion facing in the oblique detector direction and a portion of the polymer 402 are brightly imaged, and a side wall in the opposite direction and a portion of the polymer 402 are darkly imaged. In FIG. 4, different display forms represent luminance 403 in the upper portion of the polymer, luminance 404 of the sectional portion facing the detector side when the polymer is sufficiently processed, luminance 405 of the sectional portion facing in the direction opposite to the detector side when the polymer is sufficiently processed, luminance 406 of the sectional portion facing the detector side when the polymer is insufficiently processed, and luminance 407 of the sectional portion facing in the direction opposite to the detector side when the polymer is insufficiently processed.

As a difference in brightness between the bright portion and the dark portion further increases, a surface step difference becomes deeper. As the difference in brightness further decreases, the surface step difference becomes shallower. Accordingly, it is possible to determine whether the processing radiation is sufficient by using the image obtained by the oblique detector. More specifically, the control device forms a histogram in which the horizontal axis represents the luminance and the vertical axis represents the number of detections, based on a signal output of the oblique detector arranged in a specific direction. In this manner, it is considered that the processing is completed when a luminance difference between two peaks inside the histogram which have predetermined luminance reaches a predetermined value or greater. In addition, as the processing progresses, the section facing the detector side becomes brighter. Accordingly, when the luminance in the edge portion on the detector side reaches the predetermined value or greater, it may be determined that the processing is completed. However, the luminance of the edge portion varies depending on a shape of the section or a material of the polymer. Accordingly, it is possible to more precisely detect that the processing is completed by employing a determination method based on a relative ratio between the bright portion luminance and the dark portion luminance.

Without prolonging a measurement time or performing unnecessary beam radiation, it is possible to realize very precise measurement by very precisely detecting that the processing is completed. In addition, it is possible to immediately proceed to the measurement after the processing by separately providing a detector for measurement and a detector for monitoring the processing.

In the above-described determination for the processing amount, a case is assumed where the side wall direction of the pattern is not necessarily coincident with the orientation of the oblique detector. As the oblique detector, multiple oblique detectors may be installed corresponding to different orientations. FIG. 5 illustrates an example where oblique detectors are independently arranged in four orientations. Signal electrons 501a, 501b, 501c, and 501d generated from the sample 210 by the electron beam 220 are respectively detected by oblique detectors 502a, 502b, 502c, and 502d. Alternatively, multiple detection elements (semiconductor detector, multi-channel plate, avalanche photodiode, and CCD) into which detectors respectively having a single detection surface are divided may be used. FIG. 6 illustrates an example of the oblique detector in which the detection element divided into four elements is arranged. The signal electron is detected by any one of elements 601a, 601b, 601c, and 601d depending on the radiation direction thereof.

Furthermore, in order to more efficiently perform the processing radiation, it is possible to change the diameter of the electron beam during the observation to the different diameter for the sample by using the lens control circuit 233 or 238. In addition, it is also possible to perform the radiation with energy which is different from that of the electron beam during the observation by using the control power source 231. Similarly, in order to efficiently perform the processing, a current amount, scanning speed, and scanning area can be set differently from those during the observation.

Embodiment 2

Hitherto, a case has been mainly described where the processing before measurement is performed by using a beam for measurement or a beam in which the beam parameters of the beam for measurement is changed. However, hereinafter, an example will be described where processing is performed by disposing a beam source which is different from a beam source of the beam for measurement inside the charged particle radiation device, and by using the different beam source.

In the present embodiment, an example will be described where the beam source for processing is formed parallel to the sample surface in order to radiate a processing beam in the direction perpendicular to the sample surface. In order to dispose the processing beam source inside the charged particle radiation device, it is necessary to arrange the processing beam source at a position except for a trajectory of the beam discharged from the beam source for measurement. For example, when the processing beam source is arranged at a position which is oblique to the trajectory of the beam for measurement, the beam is radiated in the direction oblique to the sample surface. Consequently, the polymer is unevenly removed, thereby causing a possibility of error occurrence in inspection and measurement.

In addition, it is also conceivable that the obliquely introduced beam is bent and introduced to an observation target site by a deflector in order to radiate the beam in the direction perpendicular to the observation target site. However, the deflector for bending generally causes an aberration in the electron beam for observation. Accordingly, if the surface processing and the observation are concurrently performed, resolution may become poor. The poor resolution causes a possibility of inaccurate measurement when a narrow pitch pattern is measured.

In addition, if the other electron source such as a flood gun is provided, there is also a possibility that a vacuum chamber may increase in size.

In the present embodiment, a configuration will be mainly described in which a first charged particle beam used for observation is not the same as a second charged particle beam radiated to an observation target area in advance. In addition, an example will also be described together in which the observation using the first charged particle beam and the radiation using the second charged particle beam are concurrently performed. Furthermore, an example will also be described in which a discharge source of the first charged particle beam (first charged particle beam source) has the same particle beam optical axis as a discharge source of the second charged particle beam (second charged particle beam source).

Since both of these have the same optical axis, it is possible to perform processing by evenly radiating the charged particle to a narrow pitch pattern, and it is possible to perform the processing and the observation without moving a sample, thereby enabling a vacuum chamber to be miniaturized. In addition, the beam discharged from the discharge source of the processing beam is perpendicular to the sample surface, and the processing beam and the beam for measurement are coaxial with each other. Accordingly, it is possible to perform the processing and the measurement without poor resolution caused by deflection of the deflector.

According to the present embodiment, even when molecular polymers formed by means of the DSA method are arranged so as to have no surface step difference and have no significant difference in mass density, it is possible to provide the charged particle radiation device which can very visibly recognize a molecular boundary. In addition, it is possible to efficiently and uniformly decrease a volume of the polymer in a short time while maintaining resolution. Therefore, it is possible to perform very precise inspection and measurement of a fine pattern.

Hereinafter, a specific example of the present embodiment will be described with reference to the drawings. FIG. 7 illustrates a schematic view of a scanning electron microscope (SEM). An electron source 701 is held at a negative potential with respect to a sample by a control power source 731. An extraction electrode 702 is set to be located at a further positive potential from the electron source 701 by a positive voltage power source 732 superimposed on the control power source 731, thereby extracting an electron beam 720. An electron beam 720 is radiated onto an observation target sample 710 through a focusing lens 703 and an objective lens 708. A diameter of the electron beam 720 radiated onto the observation target sample 710 is properly controlled by lens control circuits 733 and 738. In addition, a current amount of the electron beam 720 is detected by the Faraday cup 705, and is measured by current measurement means 735. The electron beam 720 is radiated in order to scan an observation target field by a deflector 707 operated by a deflection control circuit 737. When the electron beam 720 is moved rearward from the sample 710, a beam blanker 704 is operated by using a beam blanker power source 734. A signal electron generated from the sample 710 is detected by a detector 706, and is imaged by a signal processing device 736 so as to acquire a microscopic image.

A planar electron source 709 is arranged between the sample 710 and the objective lens 708, and an operation thereof is controlled by a control power source 739. The planar electron source performs processing radiation on only a DSA pattern. The planar electron source 709 shares an optical axis with an electron source 701 for observation. FIG. 8 illustrates a specific form of the coaxially arranged planar atom source 709.

The planar electron source 709 is an annular type which has a disk shape and has a hole in the center. In particular, since the electron beam 720 shares an axis with the center hole, it is regarded that two electron sources 709 and 701 are arranged coaxially with each other. As long as the vicinity of an observation target site of the sample 710 can be equally processed, an outer diameter portion of the planar electron source 709 may have another shape instead of the circular shape. Even in this case, the characteristic configuration according to the present invention is not impaired. As illustrated in FIG. 8, the planar electron source 709 is configured to include a discharge surface 802 and an extraction surface 803. The control power source 739 is configured to include a high-voltage power source 805 which determines an acceleration voltage of the planar electron source 709, and a high-voltage power source 806 which determines a potential difference between the extraction surface 803 and the discharge surface 802 so as to extract the electron beam.

According to the configuration illustrated in FIG. 7, signal electrons generated from the sample are mostly blocked by the planar electron source 709, and a small number of electrons reach the detector 706. In this case, as illustrated in FIG. 9, an oblique detector 901 may be installed on an outer side of the planar electron source 709. In particular, as described in the first embodiment, since it is important to detect the edge portion of the observation pattern by using the oblique detector, this oblique detector 901 can function as a main detector.

Alternatively, as illustrated in FIG. 10, the planar electron source 709 may be installed on the electron source 701 side from the objective lens 708 and the detector 706. According to this configuration, a signal electron 1001 can be efficiently detected. In this case, an angle at which the sample 710 is viewed from the planar electron source 709 becomes smaller, thereby causing a possibility that the amount of the radiated electrons may decrease. It is necessary to cause the objective lens 708 or a separately provided lens to efficiently introduce a current radiated from the planar electron source 709 to the sample 710.

Alternatively, as illustrated in FIG. 11, a configuration can also be adopted in which the height for arranging the planar electron source 709 is set to be the same as that of a focusing point 1102 of a signal electron 1101. The focusing point 1102 is sufficiently small, and can pass through the center hole of the planar electron source 709. According to this method, the planar electron source 709 can be arranged so as to be closer to the sample 708 side than the detector 709. Therefore, it is possible to efficiently introduce the radiated current to the sample 710.

Embodiment 3

Furthermore, another embodiment will be described with reference to the drawings. FIG. 12 illustrates a schematic view of a scanning electron microscope (SEM). An electron source 1201 is held at a negative potential with respect to an observation target sample 1211 by a control power source 1231. A potential of the electron source 1201 with respect to the sample 1211 is set to VP (<0). An extraction electrode 1202 is set to be located at a further positive potential VP 1 from the electron source 1201 by a positive voltage power source 1232 superimposed on the control power source 1231, thereby extracting an electron beam 1220. An electron beam 1220 is radiated onto the sample 1211 through a focusing lens 1203 and an objective lens 1208. A diameter of the electron beam 1220 radiated onto the observation target sample 1211 is properly controlled by lens control circuits 1233 and 1238. In addition, a current amount of the electron beam 1220 is detected by a Faraday cup 1205, and is measured by current measurement means 1235. The electron beam 1220 is radiated in order to scan an observation target field by a deflector 1207 operated by a deflection control circuit 1237. When the electron beam 1220 is moved rearward from the sample 1211, a beam blanker 1204 is operated by using a beam blanker power source 1234.

A signal electron generated from the sample 1211 is detected by an in-lens detector 1206 installed on the further electron source 1201 side from the objective lens 1208, or by an oblique detector 1214 installed in a specific direction. The signal electron is imaged by a signal processing device 1236 or 1244, thereby acquiring a microscopic image. An energy filter 1213 is arranged between the oblique detector 1214 and the sample 1211. A threshold voltage of the energy filter 1213 is controlled by a high-voltage power source 1243.

A planar electron source 1209 is arranged between the sample 1211 and the objective lens 1208. A potential of the planar electron source 1209 is controlled by a control power source 1239. The potential of the planar electron source 1209 with respect to the sample 1211 is set to VF. Furthermore, the planar electron source 1209 has a mesh-shaped extraction surface 1210. A potential VF1 of the extraction surface 1210 with respect to the planar electron source 1209 is controlled by a high-voltage power source 1240 superimposed on the control power source 1239. The electron beam radiated from the planar electron source 1209 to the sample 1211 perform processing radiation on a only a DSA pattern. When the radiation is not performed from the planar electron source 1209 to the sample 1211, a beam blanker can be installed in principle between the planar electron source 1209 and the sample 1211. However, an area for radiation is large, and thus the beam blanker is less likely to deflect the electron beam. Accordingly, a method for decreasing the number of electrons which reach the sample by sufficiently decreasing the potential difference VF or setting a positive value, or alternatively a method for decreasing the number of electrons which are discharged from the planar electron source 1209 by sufficiently decreasing a potential difference VF1 or setting a negative value is used.

Next, referring to FIG. 13, a method will be described in which electron beam radiation for processing by using the planar electron source 1209 and acquisition of an SEM image are concurrently performed. FIG. 13 illustrates details of the planar electron source and the oblique detector in FIG. 12. It is not always necessary to use the oblique detector, and it is also possible to perform both of theses by adopting a similar configuration using the in-lens detector 1206.

When the processing radiation and the acquisition of the SEM image are concurrently performed, not only the electron beam 1220 but also an electron beam 1303 radiated for the processing generate a signal electron 1304 from the sample 1211. Spatial resolution of the SEM image is determined by a diameter of the electron beam 1220 on the sample 1211. The electron beam 1303 for processing spreads spatially so as to be sufficiently wider than the diameter of the electron beam 1220. Accordingly, the signal electron generated by the electron beam 1303 for processing cannot be provided with high spatial resolution. If the signal electrons generated by both the electron beams are concurrently detected, the resolution of the SEM image becomes poor. In order to avoid this problem, the potential VP of the electron source 1201 is set at a further negative potential than the potential VF of the planar electron source 1209 (set to VP<VF).

According to this setting, kinetic energy of the electron beam 1220 for observation when being incident on the sample 1211 is greater than kinetic energy of the electron beam 1303 for processing when being incident on the sample 1211. Accordingly, the maximum energy EP of the signal electron generated by the electron beam 1220 for observation is always greater than the maximum energy EF of the signal electron generated by the electron beam 1303 for processing (EP>EF).

Next, if a threshold voltage Eth of the energy filter 1213 is selected so as to satisfy EP>Eth>EF, a filtered signal electron 1305 detected by the oblique detector 1214 is configured to include only an electron generated by the electron beam 1220 for observation. According to the above-described method, it is possible to concurrently and efficiently perform the processing and the observation without degrading the image quality.

Embodiment 4

The above-described embodiments relate to the charged particle radiation device which mainly scans the sample pattern with the charged particle beam so as to inspect or measure the sample. The observation target sample pattern is a contact hole pattern or a via pattern in which a block copolymer and a blended polymer are formed on a guide pattern by means of induction organization.

In a case of a general semiconductor device, a circuit pattern is formed on multiple layers. A via or a contact hole is formed in order to connect the circuit patterns on the respective layers. The via or the contact hole is used for various types of connection such as circuit wiring with a transistor on the lower layer, circuit wiring with other elements, and connection between wires. According to a process of manufacturing the via pattern or the contact hole in the related art, a method is generally used in which lithography and etching are sequentially performed in accordance with a position and a size which are determined by design data. According to recently used immersion lithography and dry etching, a via pattern of approximately 30 nm can be formed. However, it becomes difficult to use the optical lithography in the related art in order to resolve the via pattern exceeding 22 nm node. In order to solve this fundamental problem requiring a fine semiconductor device pattern, various efforts such as double exposure, super-resolution technology, EUV exposure, and electron beam exposure have been made so far. However, such efforts currently and totally do not meet requirements for mass production in terms of manufacturing cost and a technology level.

According to patterning technology in which a block copolymer or a blended polymer is formed by using induction organization, it is possible to form a fine pattern without using an expensive exposure device. In particular, when a DSA hole is formed by using a hole pattern serving as a guide, it becomes possible to generate a fine hole pattern while controlling a position of the pattern.

If the block copolymer or the blended polymer is applied onto and annealed in the hole pattern serving as the guide formed on a substrate by means of optical lithography and etching, the polymer is separated into a cylindrical shape due to an induction organization phenomenon. Thereafter, one polymer is removed due to phenomenon, and hole patterning is completed after an etching process.

If a charged particle beam instead of the phenomenon is radiated in a state after the induction organization, polymer components (for example, PMMA or the like) which are likely to react to the charged particle beam are patterned by a shrinking phenomenon. In this manner, according to an inspection device for radiating the charged particle beam before the phenomenon, it is also possible to obtain a locally separated DSA pattern image.

Based on the image obtained in this way, it is possible to measure and evaluate a diameter of the DSA hole or misalignment between the formed DSA hole and the guide pattern.

If there is no problem in the evaluation result, a development process is performed, and the hole pattern is formed after an etching process. If the result of the evaluation is unsatisfactory, rework is carried out, or the pattern is formed again by changing parameters of the manufacturing device which are used during the previous process. In this manner, it is possible to improve a yield or quality in the semiconductor manufacturing process by feeding information obtained through measurement or evaluation of the fine hole pattern using the charged particle beam, back to the manufacturing device.

In a case of the charged particle radiation device used for the inspection during the semiconductor process using a length measurement SEM, it is necessary to determine the number of scanning frames in advance for an automatic operation. A pattern edge can be observed by radiating the electron beam to the pattern during the DSA process, but interaction between the charged particle beam and the polymer component, such as the shrinking phenomenon, is generally unstable. Consequently, it is difficult to uniquely determine the number of integrated frames. Therefore, it is difficult to detect a position of the pattern by means of template matching using a registered template.

According to this method, a signal-noise ratio is low due to the characteristics of the charged particle radiation device. It is difficult to detect a pattern edge by separating the signal and the noise from each other using fewer additional signals.

As described above, if the charged particle beam is not radiated during a fixed time in the DSA process, an image is not stable. Consequently, it is difficult to determine a time required for radiating the electron beam before an optimum image is acquired.

Even if the pattern is detected by using the registered template, the pattern to be observed in the DSA process is likely to vary due to the radiation of the charged particle beam. Consequently, there is a possibility that misalignment may occur.

It becomes necessary to measure and monitor the misalignment between the guide pattern and the formed DSA pattern in the DSA process.

In the following embodiment, a scanning electron microscope will be described which performs scanning with the charged particle beam in a state after induction organization using the block copolymer or the blended polymer, and which recognizes and measures a pattern position based on information and evaluation criteria which are obtained from the charged particle discharged from a scanned location. In addition, a method will also be described in which a change in the signal or the image is captured from the pattern in the DSA process by radiating the electron beam, and in which parameters such as the number of integrated frames are determined based on an evaluation value thereof.

An example will also be described in which a measurement range or a pattern position is detected by using the evaluation value in proper combination with signal strength, a luminance change in an image, edge sharpness, and edge continuity.

An example will also be described in which a noise level such as a variance value is measured in advance from an image at an initial stage of radiating the charged particle beam to the DSA pattern, and in which the noise level is used as the evaluation criteria in order to separate the pattern edge signal and the noise from each other.

An example will also be described in which an edge of the guide pattern or a time for stabilizing the luminance in the DSA pattern is determined by capturing a signal or a change in the image from the pattern in the DSA process.

An example will also be described in which an unstable pattern signal in the DSA process is not used even when the pattern is detected by registering a template, and in which a guide pattern image after etching or a pseudo image generated from design data is registered as the template so as to be used in detecting the pattern.

According to the above-described configurations, it is possible to recognize and measure a pattern position in a state after the induction organization using the block copolymer or the blended polymer. According to this method, a measurement range is automatically set.

When the pattern in the DSA process is imaged during the automatic operation of the charged particle radiation device, it is possible to determine the proper frame number or a proper pre-dose time. It becomes possible to detect or measure a stable pattern position by using multiple evaluation values. Furthermore, the noise level is measured in advance from the image at the initial stage of radiating the charged particle beam to the DSA pattern so as to separate the pattern edge signal and the noise from each other. In this manner, it is possible to minimize erroneous detection of the pattern.

When the automatic operation is performed by registering the template, a guide pattern image obtained after etching or a pseudo image generated from design data is registered as the template and used for pattern detection. In this manner, it is possible to stably detect the pattern.

FIG. 18 is a block diagram illustrating a schematic configuration of the scanning electron microscope. An overall control unit 1825 controls the overall device via an electron optical system control device 1826 and a stage control device 1827, based on information relating to an electron acceleration voltage and a wafer 111 and observation position information which are input through a user interface 1828 by an operator. A wafer 1811 is fixed onto a stage 1812 located in a sample chamber 1813 after passing through a sample exchange chamber via a sample conveying device (not illustrated).

In accordance with an instruction from the overall control unit 1825, the electron optical system control device 1826 controls a high-voltage control device 1815, a first condenser lens control unit 1816, a second condenser lens control unit 1817, a secondary electron signal amplifier 1818, an alignment control unit 1819, a deflection signal control unit 1822, and an objective lens control unit 1821.

A primary electron beam 1803 extracted from an electron source 1801 by an extraction electrode 1802 is converged by a first condenser lens 1804, a second condenser lens 1806, and an objective lens 1810, and is radiated onto a sample 1811. The electron beam intermediately passes through a diaphragm 1805, and a trajectory of the electron beam is adjusted by an alignment coil 1808. In addition, a deflection coil 1809 which receives a signal from a deflection signal control unit 1822 via a deflection signal amplifier 1820 two-dimensionally scans the sample with electron beam. Due to the primary electron beam 1803 radiated on the wafer 1811, secondary electrons 1814 discharged from the sample 1811 are captured by a secondary electron detector 1807, and is used as a luminance signal of a secondary electron image display device 1824 via a secondary electron signal amplifier 1818. A deflection signal of the secondary electron image display device 1824 and a deflection signal of the deflection coil are synchronized with each other. Accordingly, a pattern shape on the wafer 1811 can be faithfully reproduced on the secondary electron image display device 1824.

In addition, in order to create an image used in measuring dimensions of the pattern, a signal output from the secondary electron signal amplifier 1818 is analog-to-digital converted inside an image processor 1823 so as to create digital image data. Furthermore, a secondary electron profile is created from the digital image data. In the present embodiment, image data serving as an integration target (to be described later) is selected using a calculation device such as the image processor 1823. In addition, in some cases, the calculation device and the control unit may be collectively referred to as a simply control device.

A range to be measured from the created secondary electron profile is manually selected or automatically selected based on a fixed algorithm, and the number of pixels in the selected range is calculated. Actual dimensions of the observation target area scanned by using the primary electron beam 1803 and actual dimensions on the sample are measured from the number of pixels corresponding to the observation target area.

Hitherto, the scanning electron microscope using the electron beam has been described as an example of the charged particle radiation device. However, without being limited thereto, the present embodiment may employ an ion beam radiation device using an ion beam, for example.

FIG. 19 illustrates a schematic view 1900 of a representative pattern image used in measuring a DSA hole pattern with a guide pattern. The schematic view 1900 of the DSA hole pattern image includes four DSA hole patterns (1901, 1902, 1903, and 1904) with the guide pattern. Hole patterns (1911, 1912, 1913, and 1914) serving as a guide are generally formed through a lithography process and an etching process which are performed by an optical exposure device in the related art. Commonly, DSA hole patterns (1921, 1922, 1923, and 1924) are subjected to induction organization by separating a polymer in an annealing process after a block copolymer or a blended polymer is applied thereto. Thereafter, one polymer is removed due to the phenomenon, and the patterning is completed after the etching process. However, if the electron beam instead of the phenomenon is radiated in a state after the induction organization, the polymer (for example, PMMA or the like) which is likely to react to the electronic beam is patterned by a shrinking phenomenon. Even in this manner, an edge of the DSA hole becomes visible. As described above, according to an inspection device for radiating the electron beam before the phenomenon, it is also possible to obtain a locally (only an inspection point) separated DSA pattern image. Hereinafter, the block copolymer will be described, but the same description may be applied to the blended polymer.

FIG. 20 is a schematic view illustrating frame-by-frame images showing a state where the DSA hole is imaged when the electron beam is radiated to the DSA hole pattern to which the block copolymer is applied. FIG. 20 illustrates a state where the guide pattern and the DSA hole pattern appear gradually from an image 2000 obtained before the electron beam is radiated (images 2000, 2010, 2020, 2030, 2040, and 2050). In the image 2000 obtained after the electron beam is radiated, not only the guide pattern but also the DSA hole can hardly be observed. In the image 2050 to which the electron beam is sufficiently radiated, an edge 2052 of the guide pattern and a bottom portion 2053 of the DSA hole pattern obtained after the block copolymer is separated therefrom can be clearly observed. Here, the drawing illustrates the hole pattern in each frame image. However, in a case of a line pattern, a signal profile for every one line scanning may be illustrated. In addition, every other several images obtained by averaging the frames may be used.

FIG. 21 illustrates an image obtained by calculating a difference between a preceding image and a trailing image in the frame-by-frame images described with reference to FIG. 20. A differential image 2110 is an image obtained by subtracting the frame image 2100 from the frame image 2110. Similarly, a differential image 2120 is obtained by subtracting the frame image 2110 from the frame image 2120, and a differential image 2130 is obtained by subtracting the frame image 2120 from the frame image 2130, respectively. A differential image 2150 is obtained by subtracting the frame image 2040 from the frame image 2050, but a luminance value thereof is a value close to zero. This indicates that there is almost no change between the frame image 2050 and the frame image 2040. According to the present application of the invention, the frame number, a position of the guide pattern, and a position of the DSA pattern are detected by capturing this change. In this way, proper device parameters can be selected by comparing multiple images extracted in a process of scanning the same object with the beam. The multiple images obtained by the different frame number are basically obtained from the same object. In other words, autocorrelation evaluation is performed. For example, a reference image is prepared in advance so as to compare cases where the device parameters are selected based on the comparison with the reference image. In this manner, it is possible to perform very precise evaluation.

FIG. 22 is a graph 2200 in which an evaluation value (for example, pixel variance) obtained from the frame image in FIG. 20 is plotted. A plot point 2210 represents the evaluation value of the image 2000 in FIG. 20. A plot point 2211 represents the evaluation value of the image 2010. Herein, similarly, a plot point 2212 represents the evaluation value of the image 2020, a plot point 2213 represents the evaluation value of the image 2030, a plot point 2214 represents the evaluation value of the image 2040, and a plot point 2215 represents the evaluation value of the image 2050. As the radiated electron beam caused the pattern to gradually become clearer, the evaluation value increases (2211 and 2212). A state can be understood where the evaluation value is fully changed if the electron beam is sufficiently radiated (2213, 2214, and 2215).

FIG. 23 is a graph in which the evaluation value (for example, luminance integration value) obtained from the differential image in FIG. 21 is plotted. A plot point 2310 represents the evaluation value of the image 2110 in FIG. 21, and a plot point 2311 represents the evaluation value of the image 2120. Herein, a plot point 2312 represents the evaluation value of the image 2130, a plot point 2313 represents the evaluation value of the image 2140, and a plot point 2314 represents the evaluation value of the image 2150. Since the image is greatly changed immediately after the electron beam starts to be radiated, the evaluation value of the plot point 23610 or the plot point 2311 is a great value. It is understood that the values gradually converge on a fixed evaluation value during the second half section (plot point 2312, plot point 2313, and plot point 2314) in which the image is fully changed.

FIG. 24 illustrates procedures of detecting a position of the guide pattern and the DSA hall pattern by utilizing the evaluation value obtained by capturing a state where the block copolymer is separated due to the electron beam radiation as described above.

The stage 1812 is driven so that the stage's view is moved to a position on a wafer in which a measurement target pattern is present (S2401). After imaging parameters such as magnification are set (S2402), scanning is performed by using the electron beam (S2403), and an image is acquired (S2404). The acquired image is transferred to the image processor 1823, and an evaluation value for each image is calculated in the image processor 1823 (S2405). For example, as the evaluation value, a total sum of image variance values or pixel values of a differential image is used. An area including all pixel values may be targeted, or a pixel value of an edge portion after the pattern is recognized may be selectively used and calculated.

In accordance with parameters corresponding to a predetermined threshold value for an evaluation value of each image, scanning, image acquisition, evaluation value calculation are repeatedly performed (S2406). If the evaluation value satisfies determination parameters corresponding to the threshold value, an integrated image is created (S2407). Referring to FIG. 22, an image is output which is obtained by averaging the frame images 2030, 2040, and 2050 corresponding to evaluation values 2213, 2214, and 2215 in a section 2250 of the frame number in which the evaluation values show a threshold value 2240 or greater.

When the evaluation value obtained from the differential image in FIG. 23 is used, an image is output which is obtained by averaging the frame images 2030, 2040, and 2050 which are included in a section 2350 subsequent to the frame number 2330 in which the evaluation values show a threshold value 2340 or smaller.

That is, an example illustrated in FIG. 24 shows that the frame number obtained until a shrinking amount has a predetermined value or smaller is used in contracting a specific polymer and in monitoring the progress. A signal obtained by the subsequent frame becomes an integration target for forming a measurement target image. These parameters are associated with types of the DSA pattern, and are stored in a storage medium installed inside the control device. In this manner, it is possible to read proper device parameters corresponding to a target pattern later.

Next, a method for detecting the center of the guide pattern and the center of the DSA pattern will be described. First, referring to FIG. 22, an image 25800 as illustrated in FIG. 25 is created by integrating differential images corresponding to the evaluation values 2310, 2311, and 2312 for a section of the frame number 2260 in which the evaluation values show a threshold value 2240 or smaller, or for a frame section 2360 in which the evaluation values show the threshold value 2340 or greater in FIG. 23. A portion where a luminance value is greatly changed, such as an edge 25802 of the guide pattern portion and a DSA hole pattern portion 2503, becomes brighter as a pattern edge.

A center position of the hole pattern is detected from the image 25800 having the differential image accumulated (S2408). When the center position is detected, it is possible to separately detect an edge of the guide pattern and an edge of the DSA pattern by using the center after blob extraction or generalized Hough transform (S2409) (S2410). It is also possible to set continuity of the edge as an evaluation value by analyzing the blob. It is also possible to set variations in in differential strength at an edge position as the evaluation value by calculating the differential strength from spatial differential of the image. The method of using the continuity of the edge and the variations of the differential strength as the evaluation value can also be applied to a line pattern. In addition, according to the generalized Hough transform, it is possible to use an accumulated value of Hough space.

As another method for detecting the center of the hole pattern, it is also possible to detect the center position of the hole pattern by matching with a pattern template which is registered in advance. In this case, in order to register an image in advance, an image such as the image 2050 obtained after the electron beam is sufficiently radiated is used as the template.

The evaluation value described with reference to FIG. 22 is the pixel variation. However, when template matching is performed, it is also possible to use a correlation value as the evaluation value.

As another method for detecting the center of the hole pattern by using the template, it is also possible to use an edge contour 2601 which is generated in the template from design data as illustrated in FIG. 26, or an image 2602 of the guide pattern which is obtained before a polymer is applied thereto. When the design data is used, only edge information of the pattern is provided. Accordingly, the center position is detected by matching the template with an integrated differential image 2600. Even when a guide pattern image obtained before the polymer is applied thereto is used, an edge enhanced image 2603 obtained by applying a differential filter such as a sobel filter is used as the template, and a differential image 2500 is matched with the template, thereby detecting the center position. After the center position is detected, a length measurement cursor is arranged (S2411), and length measurement is performed (S2412). If multiple patterns are included in the image as illustrated in FIG. 20, the length measurement is performed for all of the patterns (S2409 to S2412). It is possible to accurately set a length measurement box in a hole edge portion which is a length measurement target by registering a positional relationship between the center position and the length measurement cursor in advance.

In the flow illustrated in FIG. 24, it is also possible to perform scanning by storing imaging parameters in advance and by reproducing the imaging parameters during an automatic operation. In this case, the imaging parameters can also employ the frame number 2230 in which the evaluation values show the threshold value 2240 or smaller in FIG. 22, or the frame number pre-dosed from the frame section 630 in which the evaluation values show the threshold value 2340 or greater in FIG. 23, and a time converted from the frame number.

FIG. 27 illustrates detection in a case where detection is difficult due to weak edge strength in the DSA pattern. First, an edge is detected from only a guide pattern (2702), and the center of the guide pattern is obtained (2704). Based on the center, an edge of the DSA pattern is radially detected (refer to FIG. 27). If a graph is drawn by setting an angular direction to a horizontal axis and setting a radial direction to a vertical axis, the graph is drawn as 2705. If this undulating shape is detected, it is possible to evaluate variations of the edge. If the edge is unstable, variations of the edge position greatly occur as 2705. However, if the edge becomes stable as 2706 and 2708, the edge is gently changed (2707 and 2709). In this way, it is possible to start image integration after the pattern becomes stable by monitoring the variations of the edge.

With regard to the DSA pattern measurement described above, FIG. 28 illustrates an example of a user interface for setting parameters required for measurement. A threshold value for the evaluation value is set as a threshold value for setting the "Frame number" to start the integration in FIG. 22 (2230) and FIG. 23 (2330). When automatic determination is performed, "Auto (2802)" is checked. In a case of manual setting, a threshold value thereof is set (2803). As the frame number, the integration frame number of the measure images in FIG. 22 (2250) and FIG. 23 (2350) is set. "Auto (2805)" is selected for the automatic operation, and "manual (2806)" is selected for the manual operation. In a case of "Pattern Information (2807)", the minimum allowable size and the maximum allowable size of a guide pattern (2808) and a DSA pattern (2809), and an allowable value (2810) for center misalignment between the guide pattern and the DSA pattern are set. If these values are outside the range of the allowable value, it is determined as a measurement error. In this manner, it is possible to monitor a misaligned amount on a real time basis.

REFERENCE SIGNS LIST

101 SILICON WAFER
102 GUIDE PATTERN
110 COMPOSITE POLYMER MATERIAL
111 POLYMER
112 POLYMER
201 ELECTRON SOURCE
202 EXTRACTION ELECTRODE
203 FOCUSING LENS
204 BEAM BLANKER
205 FARADAY CUP
206 IN-LENS DETECTOR
207 DEFLECTOR
208 OBJECTIVE LENS
209 OBLIQUE DETECTOR
210 OBSERVATION TARGET SAMPLE
211 SAMPLE STAGE

The invention claimed is:

1. A method for pattern measurement in which dimension measurement is performed for a pattern formed on a sample, based on detection of charged particles obtained by scanning the sample with a charged particle beam, the method comprising the steps of:
irradiating a polymer compound including at least a first polymer and a second polymer used in a self-organizing lithography technique with a charged particle beam apparatus used for the dimension measurement to contract a volume of the first polymer more than a volume of the second polymer;
after the contraction of the volume of the first polymer, scanning a region including multiple edges of the second polymer with the charged particle beam apparatus;
detecting the charged particles obtained by scanning the region with the charged particle beam with a detector; and
measuring, with a processor in communication with the detector, a dimension between the edges based on the charged particles obtained by scanning the region with the charged particle beam.

2. The method for pattern measurement according to claim 1,
wherein luminance in an edge portion of the first polymer is obtained, based on detection of a signal obtained by scanning with the charged particle beam, and
wherein radiation of the charged particle is completed, or measurement using the charged particle beam starts, based on information relating to the luminance.

3. The method for pattern measurement according to claim 2,
wherein the signal is detected by the detector which is disposed in a direction oblique from the charged particle beam.

4. The method for pattern measurement according to claim 1,
wherein the charged particles for contracting the volume of the first polymer are the charged particle beam or charged particles discharged from another charged particle source which is different from a charged particle source discharging the charged particle beam.

5. The method for pattern measurement according to claim 4,
wherein the another charged particle source is a planar electron source having a plane which is parallel to a surface of the sample.

6. A charged particle radiation device in which dimension measurement is performed for a pattern formed on a sample, based on detection of charged particles obtained by scanning the sample with a charged particle beam, comprising:
a charged particle beam apparatus that
is used for the dimension measurement,
irradiates a polymer compound including at least a first polymer and a second polymer used in a self-organizing lithography technique to contract a volume of the first polymer more than a volume of the second polymer, and
after the contraction of the volume of the first polymer, scans a region including multiple edges of the second polymer;
a detector that detects the charged particles obtained by scanning the region with the charged particle beam; and
a control device that is in communication with the detector and measures a dimension between the edges based on the charged particles obtained by scanning the region with the charged particle beam.

7. The charged particle radiation device according to claim 6,
wherein the control device obtains luminance in an edge portion of the first polymer, based on detection of a signal obtained by scanning with the charged particle beam, and completes radiation of the charged particles, or starts measurement using the charged particle beam, based on information relating to the luminance.

8. The charged particle radiation device according to claim 7, wherein
the detector is disposed in a direction oblique from the charged particle beam, and
the control device completes the radiation of the charged particles, or starts the measurement using the charged particle beam, based on an output from the detector.

9. The charged particle radiation device according to claim 6,
wherein the charged particles for contracting the volume of the first polymer is the charged particle beam or charged particles discharged from another charged particle source which is different from a charged particle source discharging the charged particle beam.

10. The charged particle radiation device according to claim 9,
wherein the another charged particle source is a planar electron source having a plane which is parallel to a surface of the sample.

* * * * *